United States Patent
Cho et al.

(10) Patent No.: US 11,881,482 B2
(45) Date of Patent: Jan. 23, 2024

(54) SEMICONDUCTOR DEVICE

(71) Applicant: SAMSUNG ELECTRONICS CO., LTD., Suwon-si (KR)

(72) Inventors: Gihee Cho, Yongin-si (KR); Sanghyuck Ahn, Daegu (KR); Hyun-Suk Lee, Suwon-si (KR); Jungoo Kang, Seoul (KR); Jin-Su Lee, Hwaseong-si (KR); Hongsik Chae, Suwon-si (KR)

(73) Assignee: Samsung Electronics Co., Ltd.

( * ) Notice: Subject to any disclaimer, the term of this patent is extended or adjusted under 35 U.S.C. 154(b) by 17 days.

(21) Appl. No.: 17/852,040

(22) Filed: Jun. 28, 2022

(65) Prior Publication Data

US 2023/0223407 A1 Jul. 13, 2023

(30) Foreign Application Priority Data

Jan. 7, 2022 (KR) .................. 10-2022-0002924

(51) Int. Cl.
| | |
|---|---|
| *H01L 27/10* | (2006.01) |
| *H10B 12/00* | (2023.01) |
| *G11C 8/14* | (2006.01) |
| *H01L 49/02* | (2006.01) |

(52) U.S. Cl.
CPC .............. *H01L 27/101* (2013.01); *G11C 8/14* (2013.01); *H01L 28/60* (2013.01)

(58) Field of Classification Search
CPC ....... H01L 27/101; H01L 28/60; H01L 28/90; H01L 28/75; H10B 12/033; H10B 12/315; H10B 12/0335
See application file for complete search history.

(56) References Cited

U.S. PATENT DOCUMENTS

| | | | |
|---|---|---|---|
| 6,399,438 B2 | 6/2002 | Saito et al. | |
| 6,670,663 B2 | 12/2003 | Hwang et al. | |
| 7,091,085 B2 | 8/2006 | Shea | |
| 7,115,935 B2 | 10/2006 | Tu et al. | |
| 9,240,441 B2 | 1/2016 | Yoon et al. | |
| 9,318,494 B2 | 4/2016 | Kim et al. | |
| 10,665,592 B2 * | 5/2020 | Song | ............ H01L 29/0649 |
| 2010/0032740 A1 | 2/2010 | Kitajima | |

* cited by examiner

*Primary Examiner* — David Vu
(74) *Attorney, Agent, or Firm* — Fish & Richardson P.C.

(57) ABSTRACT

A semiconductor device includes; a bottom electrode on a substrate, a supporting pattern between the bottom electrode and an adjacent bottom electrode, a top electrode covering the bottom electrode and the supporting pattern, and a dielectric layer between the bottom electrode and the top electrode and between the supporting pattern and the top electrode. The bottom electrode may include a first portion including a seam and a second portion on the first portion, a top end of the second portion may be disposed at a height lower than an upper surface of the supporting pattern, and a portion of a bottom end of the second portion may be exposed to the seam.

20 Claims, 29 Drawing Sheets

SEMICONDUCTOR DEVICE

CROSS-REFERENCE TO RELATED APPLICATION

This U.S. non-provisional patent application claims priority under 35 U.S.C. § 119 to Korean Patent Application No. 10-2022-0002924 filed on Jan. 7, 2022 in the Korean Intellectual Property Office, the subject matter of which is hereby incorporated by reference in its entirety.

BACKGROUND

The present disclosure relates generally to semiconductor devices, and in particular, to semiconductor memory devices including a capacitor.

Semiconductor devices have become important components in the electronics industry. Contemporary semiconductor devices are characterized by small size, multi-function operation, and/or low-cost of manufacture. Semiconductor devices may be broadly classified as either semiconductor memory devices principally used to receive, store, retrieve and provide data, or semiconductor logic devices principally used to manipulate and process data. However, certain hybrid semiconductor devices are capable of providing both memory-based functionality and logic-based functionality.

In view of recent trends in electronic devices towards higher operating with lower power consumption, many contemporary and emerging semiconductor devices are required to operate at high speed and/or at low operating voltages. Further, it is necessary to increase the integration density of many semiconductor devices. However, as the integration density of semiconductor devices increases, some semiconductor devices may suffer from deterioration in electrical performance and reduced reliability. Accordingly, ongoing research and development are directed to improving the electrical performance and overall reliability of semiconductor devices.

SUMMARY

Embodiments of the inventive concept provide semiconductor devices exhibiting improved electrical performance and better reliability characteristics.

According to an embodiment of the inventive concept, a semiconductor device may include; a bottom electrode on a substrate, a supporting pattern between the bottom electrode and an adjacent bottom electrode, a top electrode covering the bottom electrode and the supporting pattern, and a dielectric layer between the bottom electrode and the top electrode and between the supporting pattern and the top electrode, wherein the bottom electrode includes a first portion including a seam and a second portion on the first portion, a top end of the second portion is disposed at a height lower than an upper surface of the supporting pattern, and a portion of a bottom end of the second portion is exposed to the seam.

According to an embodiment of the inventive concept, a semiconductor device may include; a bottom electrode on a substrate, a supporting pattern between the bottom electrode and an adjacent bottom electrode, a top electrode covering the bottom electrode and the supporting pattern, and a dielectric layer provided between the bottom electrode and the top electrode and between the supporting pattern and the top electrode, wherein the bottom electrode includes a seam, and a top end of the bottom electrode is disposed at a height lower than an upper surface of the supporting pattern and higher than a lower surface of the supporting pattern.

According to an embodiment of the inventive concept, a semiconductor device may include; a substrate including an active pattern, an impurity region provided in the active pattern, a word line disposed in the substrate and crossing the active pattern, a bit line disposed on the substrate and extending in a direction crossing the word line, a storage node contact disposed on the substrate and electrically connected to the impurity region, a landing pad electrically connected to the storage node contact, a bottom electrode electrically connected to the landing pad, an upper supporting pattern and a lower supporting pattern provided between the bottom electrode and an adjacent bottom electrode, a top electrode covering the bottom electrode and the upper supporting pattern, and a dielectric layer provided between the bottom electrode and the top electrode and between the upper supporting pattern and the top electrode, wherein the bottom electrode includes a first portion including a seam and a second portion on the first portion, a top end of the second portion is disposed at a height lower than an upper surface of the supporting pattern, and a portion of a bottom end of the second portion is exposed to the seam.

BRIEF DESCRIPTION OF THE DRAWINGS

Advantages, benefits, and features, as well as the making and use of the inventive concept may be understood upon consideration of the following description, together with the accompanying drawings, in which.

DETAILED DESCRIPTION

Throughout the written description and drawings, like reference numbers and labels are used to denote like or similar elements, components, features, and/or method steps. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1:
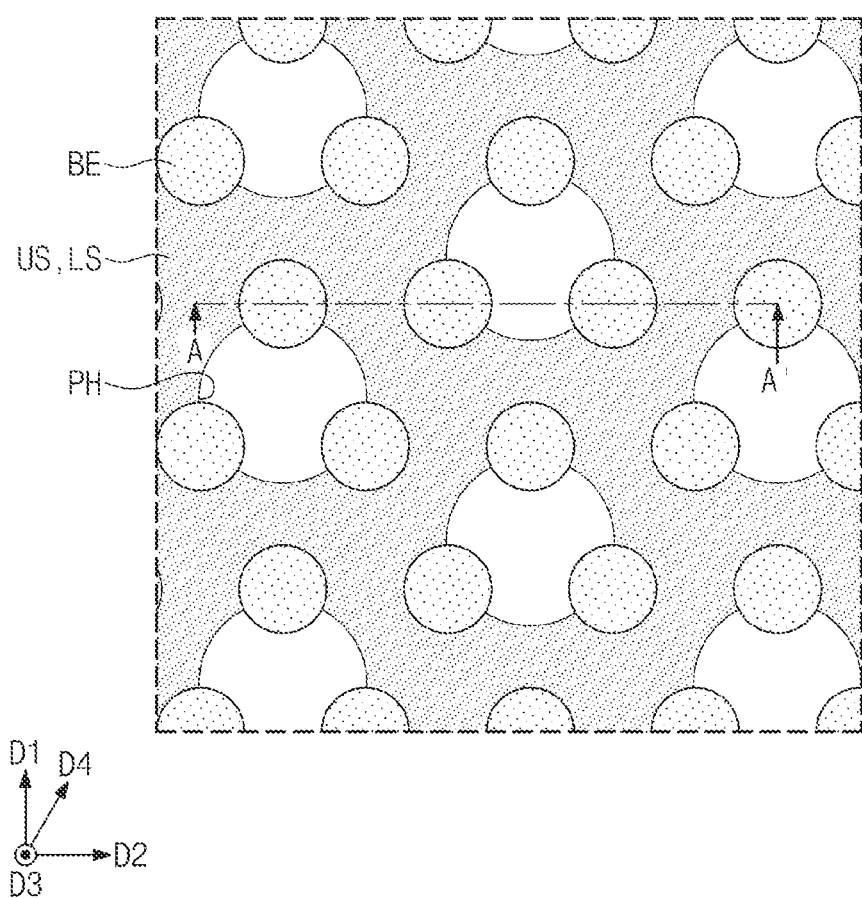
FIG. 1 is a plan (or top-down) view illustrating a semiconductor device according to embodiments of the inventive concept.
Figure 2:
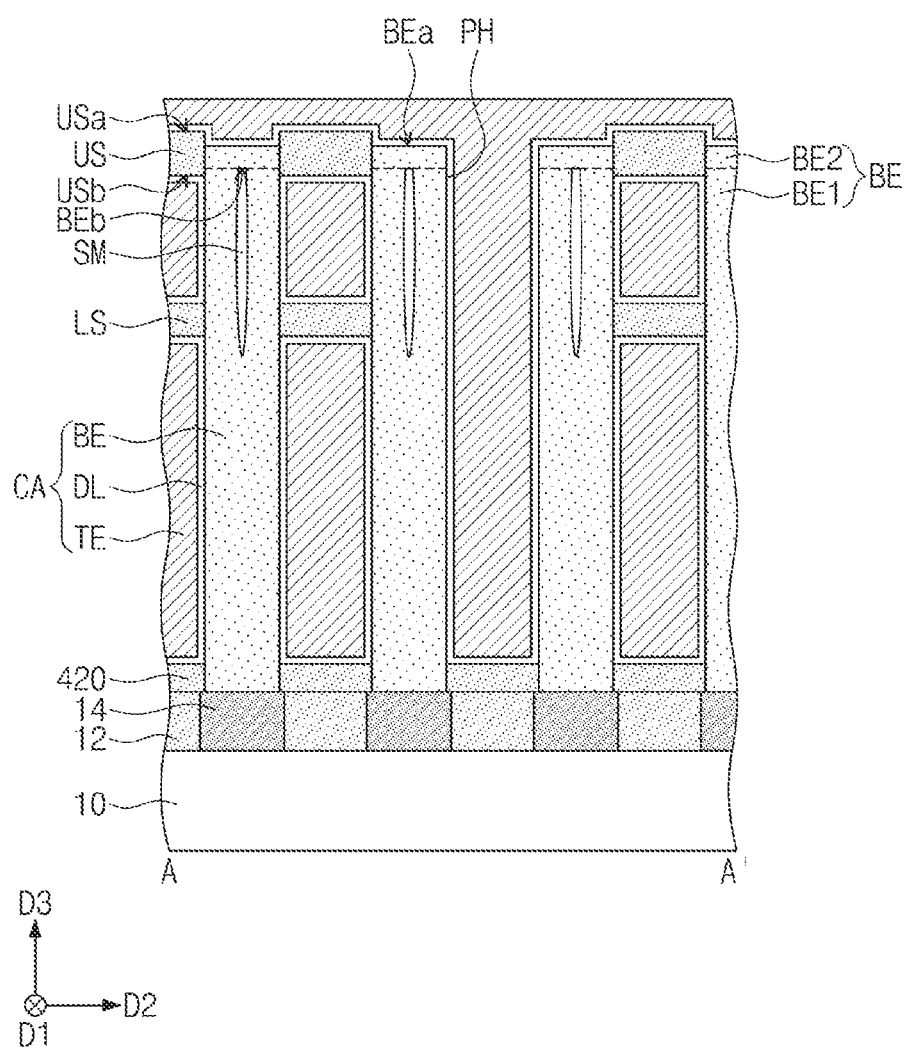
FIGS. 2 and 3 are respective cross-sectional views taken along line A-A' of FIG. 1.

FIG. 1 is a plan view illustrating a semiconductor device, and FIG. 2 is a cross-sectional view taken along line A-A' of FIG. 1 and further illustrates a semiconductor device according to embodiments of the inventive concept.

Referring to FIGS. 1 and 2, a substrate 10 may be a semiconductor substrate (e.g., a silicon substrate, a germanium substrate, a silicon-germanium substrate, etc.).

An interlayer insulating layer 12 may be disposed on the substrate 10. The interlayer insulating layer 12 may cover at least a portion of an upper surface of the substrate 10. As an example, the interlayer insulating layer 12 may "include" (e.g., may be at least partially formed of) at least one of silicon nitride, silicon oxide, and silicon oxynitride. As another example, the interlayer insulating layer 12 may include an empty region (or a void).

A conductive contact 14 may be disposed in the interlayer insulating layer 12. In some embodiments, a plurality of conductive contacts 14 may be provided, and in this case, the conductive contacts 14 may be spaced apart in a first direction D1 substantially parallel to an upper surface of the substrate 10 and a second direction D2 that intersects the first direction D1. The conductive contact 14 may include at least one of doped semiconductor materials (e.g., poly silicon), metal-semiconductor compound materials (e.g., tungsten silicide), conductive metal nitride materials (e.g., titanium nitride, tantalum nitride, and tungsten nitride), and metallic materials (e.g., titanium, tungsten, and tantalum). The conductive contact 14 may be electrically connected to an impurity region (e.g., a source/drain terminal) formed in the substrate 10.

An etch stop pattern 420 may be disposed on the interlayer insulating layer 12. The etch stop pattern 420 may cover the interlayer insulating layer 12 and may expose the conductive contacts 14. The etch stop pattern 420 may include at least one of silicon oxide, SiCN, and SiBN.

A bottom electrode BE may be disposed on the conductive contact 14. In some embodiments, the bottom electrode BE may penetrate the etch stop pattern 420 to electrically connect the conductive contact 14. The bottom electrode BE may have a pillar shape. A plurality of bottom electrodes BE may be provided, and in such an embodiment, the bottom electrodes BE may be spaced apart in the first and second directions D1 and D2. In some embodiments, the bottom electrodes BE may be arranged in a honeycomb pattern. That is, each of the bottom electrodes BE may be disposed at the center of a hexagon defined in relation to six other bottom electrodes BE.

The bottom electrode BE may include at least one conductive material, such as for example, silicon (Si), metallic materials (e.g., cobalt, titanium, nickel, tungsten, and molybdenum), metal nitride materials (e.g., titanium nitride (TiN), titanium silicon nitride (TiSiN), titanium aluminum nitride (TiAlN), tantalum aluminum nitride (TaAlN), and tungsten nitride (WN)), precious metals (e.g., platinum (Pt), ruthenium (Ru), and iridium (Ir)), conductive oxide materials (e.g., PtO, $RuO_2$, $IrO_2$, SRO ($SrRuO_3$), BSRO ((Ba, Sr)$RuO_3$), CRO ($CaRuO_3$), and LSCo), and/or metal silicide materials.

An upper supporting pattern US and a lower supporting pattern LS may be provided on the substrate 10. The upper and lower supporting patterns US and LS may be spaced apart in a third direction D3 substantially perpendicular to the upper surface of the substrate 10. The upper supporting pattern US may be disposed at a height higher than the lower supporting pattern LS. Here, supporting patterns spaced apart in the third direction D3 may be further provided, and in this case, an uppermost one of the supporting patterns may be referred to as the "upper supporting pattern US." As an example, three supporting patterns, spaced apart in the third direction D3 may be provided, and the uppermost one of the three supporting patterns may be referred to as the upper supporting pattern US. The upper and lower supporting patterns US and LS may be provided between adjacent ones of the bottom electrodes BE. Here, the upper and lower supporting patterns US and LS may contact a side surface of the bottom electrode BE and may enclose the side surface of the bottom electrode BE. The upper and lower supporting patterns US and LS may physically support the bottom electrode BE. A thickness of the upper supporting pattern US in the third direction D3 may be different from a thickness of the lower supporting pattern LS in the third direction D3. In some embodiments, each of the upper and lower supporting patterns US and LS may include at least one of silicon nitride, SiBN, and SiCN.

The bottom electrode BE may include a first portion BE1 and a second portion BE2. The bottom electrode BE may include a seam SM which is formed therein (e.g., in the first portion BE1. Thus, the first portion BE1 may be a portion of the bottom electrode BE disposed below a top end of the seam SM. The second portion BE2 may be another portion of the bottom electrode BE disposed above the top end of the seam SM and substantially provided on the first portion BE1. In some embodiments, the first and second portions BE1 and BE2 may directly contact each other (e.g., contact each other without a material interface therebetween). As an example, the first and second portions BE1 and BE2 may include at least one of the same material(s). However, the first portion BE1 may include a material which is not included in the second portion BE2, and/or the second portion BE2 may include a material which is not included in the first portion BE1.

A portion of a bottom end BEb of the second portion BE2 may be exposed to the seam SM. The bottom end BEb of the second portion BE2 may be defined at the same height as the top end of the seam SM. As an example, the bottom end BEb of the second portion BE2 may be vertically disposed higher than a lower surface USb of the upper supporting pattern US, however the inventive concept is not limited thereto.

A top end BEa of the second portion BE2 may constitute an upper surface of the bottom electrode BE. The top end BEa of the second portion BE2 may be vertically disposed lower than an upper surface USa of the supporting pattern US and higher than the lower surface USb of the supporting pattern US. That is, the upper surface of the bottom electrode BE may be disposed lower than the upper surface USa of the supporting pattern US and higher than the lower surface USb of the supporting pattern US. Accordingly, the upper supporting pattern US may physically support the bottom electrode BE. The second portion BE2 may not include the seam SM.

A penetration hole PH may be disposed between adjacent ones of the bottom electrodes BE. As an example, each of the penetration holes PH may have a circular cross-section and may be disposed between three adjacent ones of the bottom electrodes BE to expose a portion of a side surface of each of the three bottom electrodes BE. However, the inventive concept is not limited thereto, and the penetration hole PH may be otherwise provided with various cross-sectional shapes between a plurality of bottom electrodes BE. The penetration hole PH may penetrate the upper and lower supporting patterns US and LS, to expose the etch stop pattern 420. In some embodiments, a plurality of penetration holes PH may be variously spaced apart in the first and second directions D1 and D2.

A dielectric layer DL may be provided on the upper supporting pattern US, the lower supporting pattern LS, the bottom electrode BE, and the etch stop pattern 420. In some embodiments, the dielectric layer DL may conformally cover the upper supporting pattern US, the lower supporting pattern LS, the bottom electrode BE, and the etch stop pattern 420. Thus, the dielectric layer DL may contact the upper surface of the bottom electrode BE. That is, the dielectric layer DL may contact the top end BEa of the second portion BE2 of the bottom electrode BE.

The dielectric layer DL may at least partially fill the penetration holes PH. Here, the dielectric layer DL in contact with the bottom electrode BE may have a crystal structure that is the same as or substantially similar to that of the bottom electrode BE. For example, the dielectric layer DL may have a tetragonal structure. In some embodiments, the dielectric layer DL may include at least one of metal oxide materials (e.g., $HfO_2$, $ZrO_2$, $Al_2O_3$, $La_2O_3$, $Ta_2O_3$, and $TiO_2$) and perovskite dielectric materials (e.g., $SrTiO_3$ (STO), $(Ba,Sr)TiO_3$ (BST), $BaTiO_3$, PZT, and PLZT), and may be formed with either a single structure or a multi-layered structure.

A top electrode TE may be provided on the dielectric layer DL. The top electrode TE may cover the bottom electrode BE and the upper and lower supporting patterns US and LS. The top electrode TE may fill remaining portions of the penetration holes PH, spaces between the upper and lower supporting patterns US and LS, and/or spaces between the lower supporting pattern LS and the etch stop pattern 420. Thus, the dielectric layer DL may be interposed between the bottom and top electrodes BE and TE, between the upper supporting pattern US and the top electrode TE, and/or between the lower supporting pattern LS and the top electrode TE. The dielectric layer DL may be interposed between the top electrode TE and the top end BEa of the second portion BE2 of the bottom electrode BE.

The top electrode TE may include at least one for example, titanium nitride, doped polysilicon, and doped silicon germanium. The top electrode TE may be formed with a single structure or a multi-layered structure. In this regard, a combination of the bottom electrode BE, the dielectric layer DL, and the top electrode TE may constitute a capacitor CA. In a case wherein the semiconductor device is a semiconductor memory device, the capacitor CA may be used as a data storage element for constituent memory cell(s).

Figure 3:
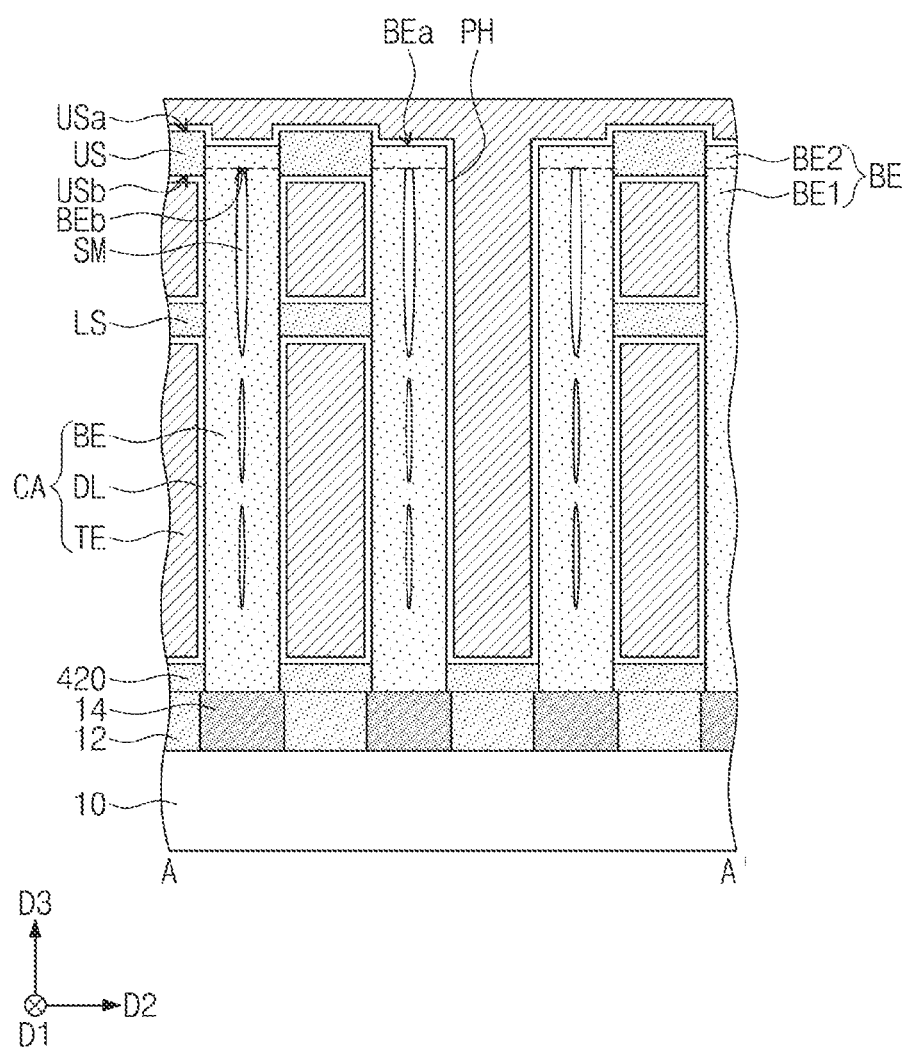

FIG. 3 is a cross-sectional view taken along line A-A' of FIG. 1 and further illustrates a semiconductor device according to other embodiments of the inventive concept.

Referring to FIGS. 1 and 3, the bottom electrode BE may include the first and second portions BE1 and BE2, and may include a plurality of seams SM vertically formed therein at different heights. The seams SM may be disposed in the first portion BE1 of the bottom electrode BE. The first portion BE1 may be a portion of the bottom electrode BE disposed below a top end of the uppermost one of the seams SM. The second portion BE2 may be another portion of the bottom electrode BE disposed above the top end of the uppermost one of the seams SM, and may be provided on the first portion BE1. Here, the first and second portions BE1 and BE2 may contact each other without a material interface therebetween.

Further, at least a portion of the bottom end BEb of the second portion BE2 may be exposed to the uppermost one of the seams SM. The bottom end BEb of the second portion BE2 may be defined at the same height as the top end of the uppermost one of the seams SM.

Figure 4:
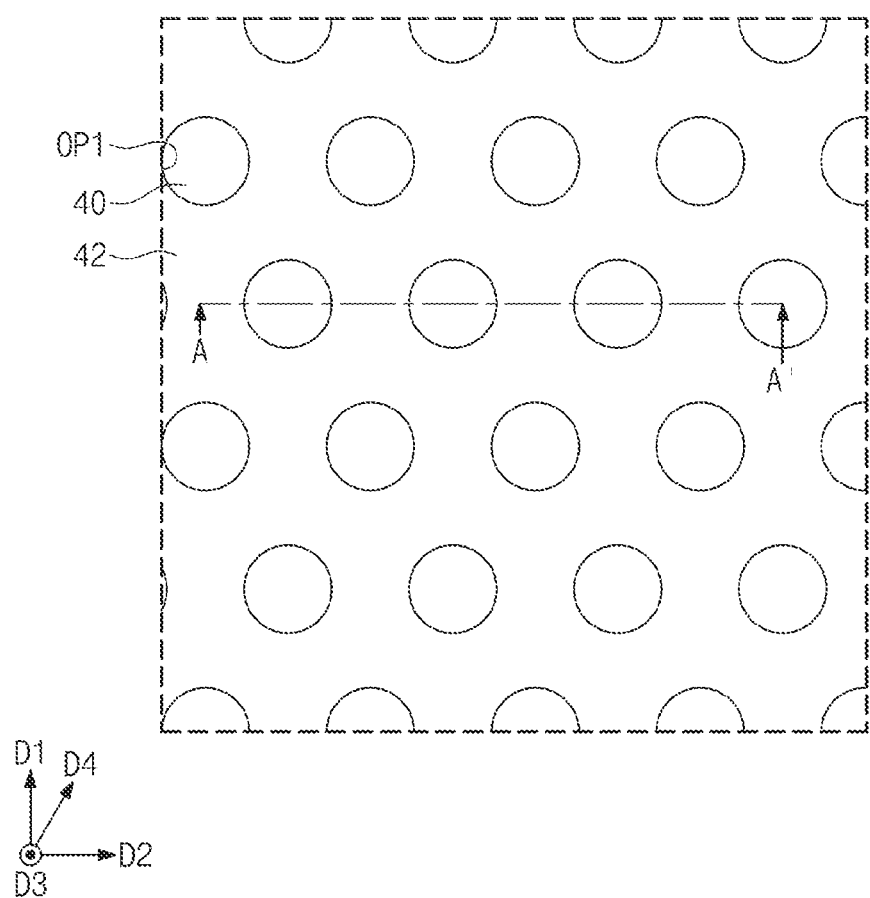
FIGS. 4, 5, 6, 7, 8, 9, 10, 11, 12 and 13 (hereafter collectively, "FIGS. 4 to 13") are related views illustrating a method of manufacture for the semiconductor device of FIG. 2.
Figure 9:
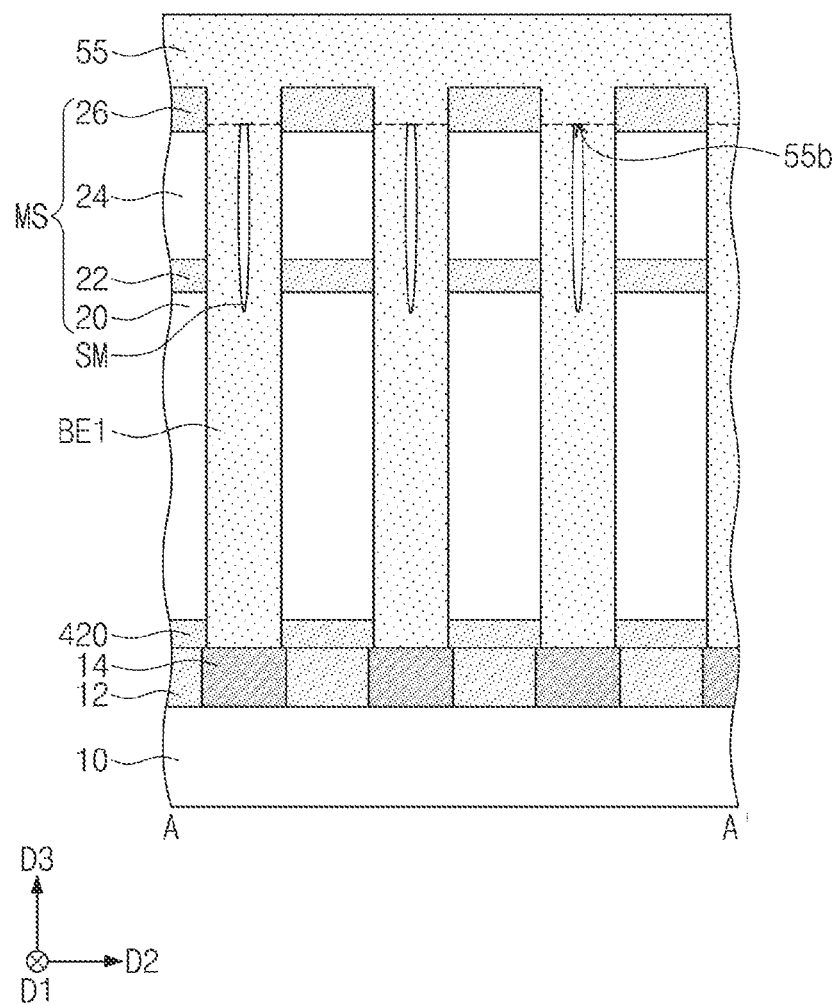
Figure 10:
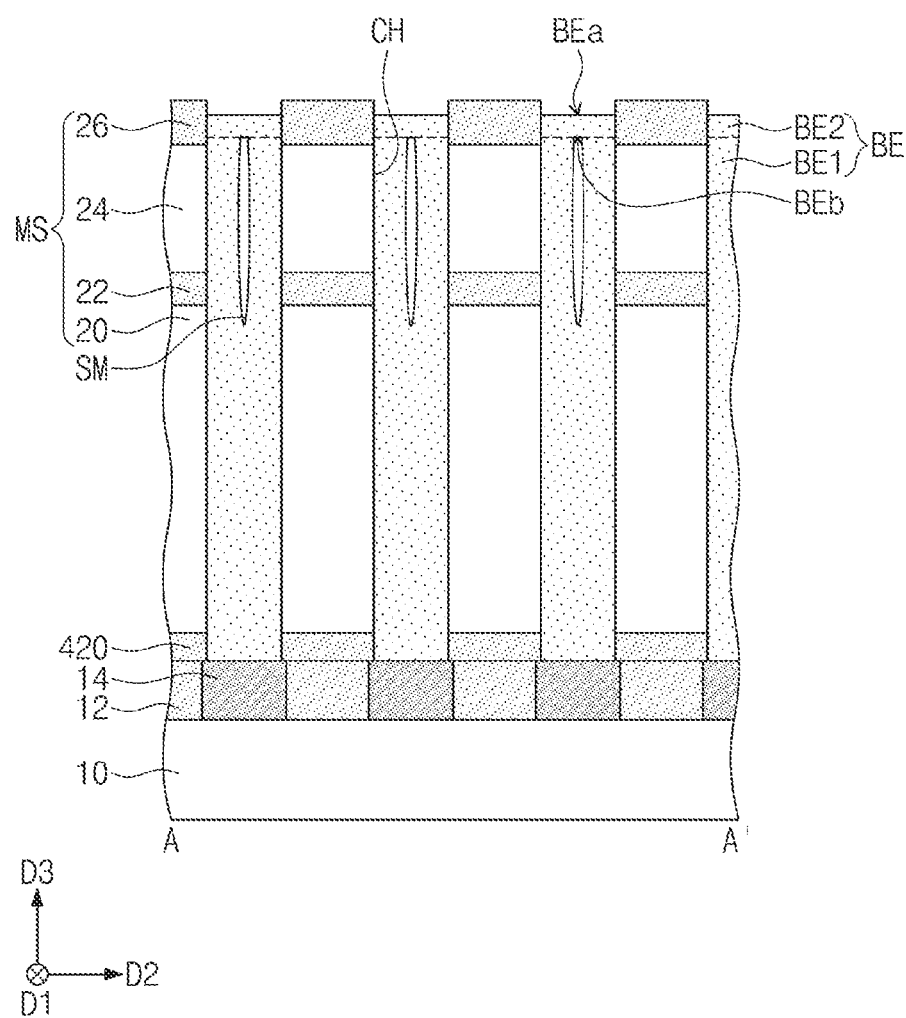
Figure 11:
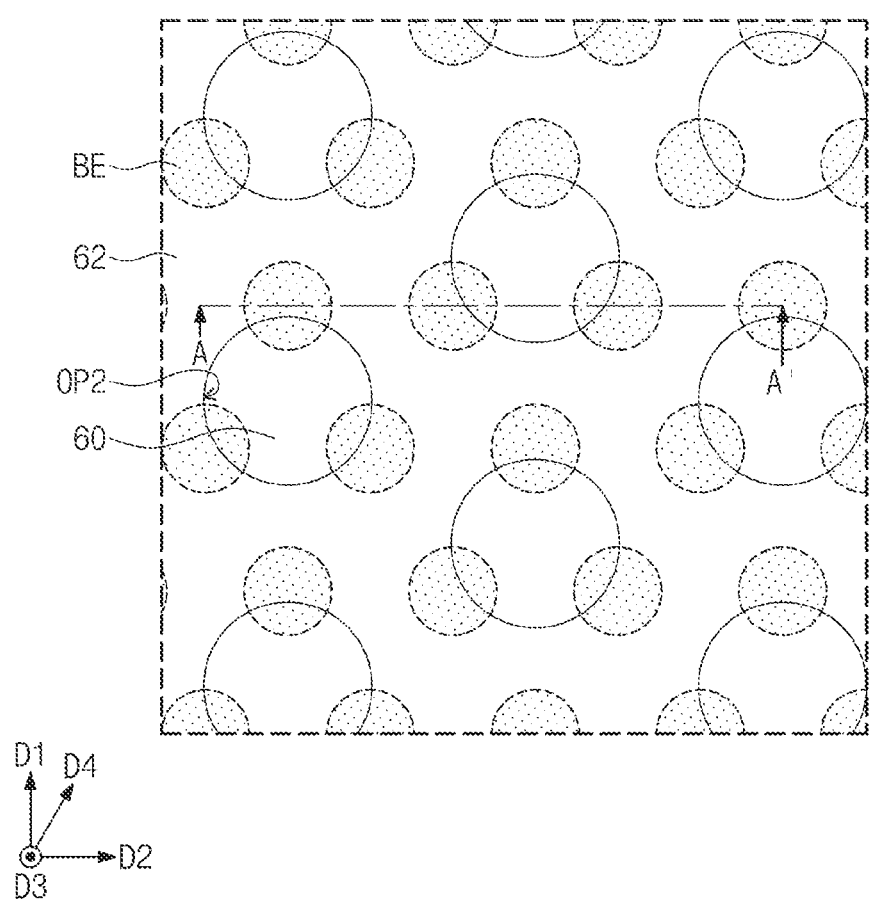

FIGS. 4 to 13 are related diagrams illustrating a method of manufacture for the semiconductor device of FIG. 2, wherein FIGS. 4 and 11 are plan views and FIGS. 5, 6, 7, 8, 9, 10, 12, and 13 are cross-sectional views.

Figure 5:
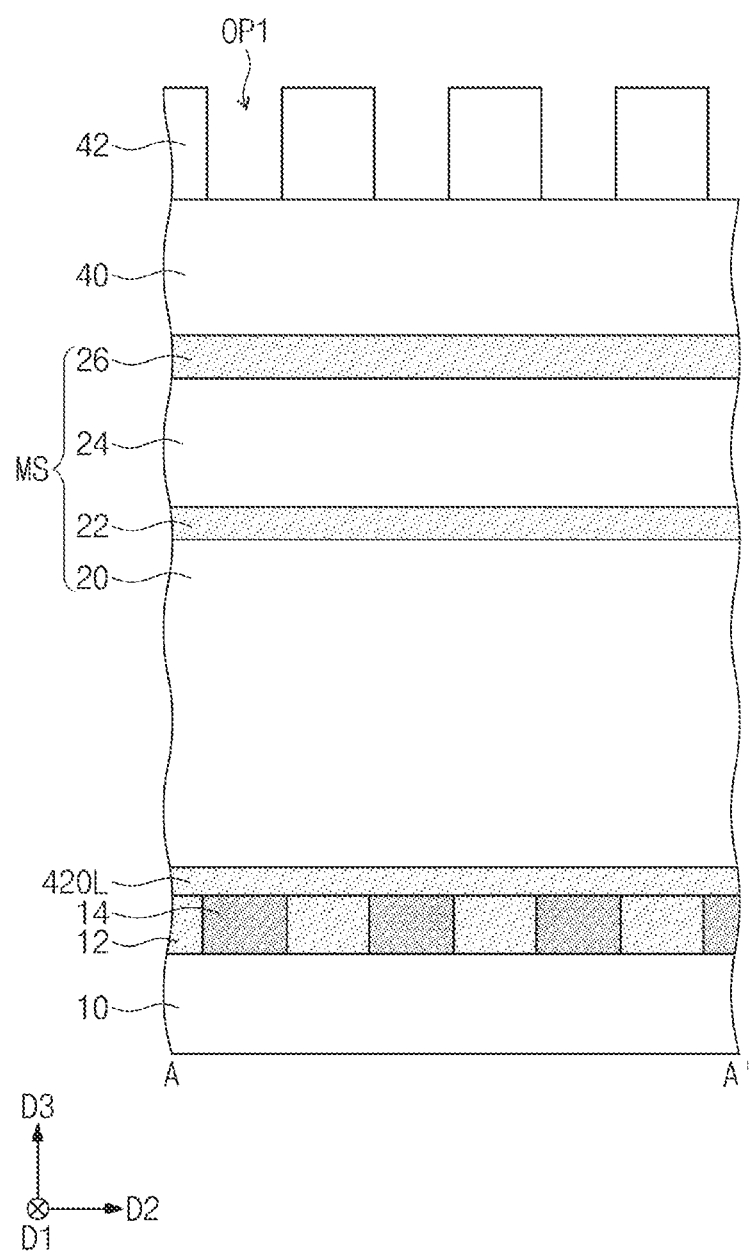

Referring to FIGS. 4 and 5, the substrate 10 is and the interlayer insulating layer 12 is formed thereon. The conductive contact 14 may be formed in the interlayer insulating layer 12. An etch stop layer 420L may be formed on the substrate 10, wherein the etch stop layer 420L may be formed to cover an upper surface of the interlayer insulating layer 12 and an upper surface of the conductive contact 14.

A mold structure MS may be formed on the etch stop layer 420L. The mold structure MS may include mold layers and supporting layers 9 e.g., which may be alternately stacked) on the etch stop layer 420L. As an example, the mold structure MS may include a first mold layer 20, a lower supporting layer 22, a second mold layer 24, and an upper supporting layer 26, which are sequentially stacked. The lower supporting layer 22 may include a material having an etch selectivity with respect to the first mold layer 20. The upper supporting layer 26 may include a material having an etch selectivity with respect to the second mold layer 24. In some embodiments, the first and second mold layers 20 and 24 may include at least one of the same material(s). As an example, the first and second mold layers 20 and 24 may include silicon oxide. The lower and upper supporting layers 22 and 26 may include at least one of the same material(s). As an example, the lower and upper supporting layers 22 and 26 may include at least one of silicon nitride, SiBN, and SiCN.

A first mask layer 40 and a second mask pattern 42 may be sequentially formed on the mold structure MS. The first mask layer 40 may cover the upper supporting layer 26. In some embodiments, the first mask layer 40 may include at least one of polysilicon, silicon nitride, and silicon oxynitride. The second mask pattern 42 may be formed on the first mask layer 40 and may have a first opening OP1. In some embodiments, a plurality of first openings OP1 may be provided, and a portion of an upper surface of the first mask layer 40 may be exposed through the first opening OP1. The first opening OP1 may be vertically overlapped with the conductive contact 14. In some embodiments, the second mask pattern 42 may include at least one of spin-on-hardmask (SOH) materials and amorphous carbon layer (ACL).

Figure 6:
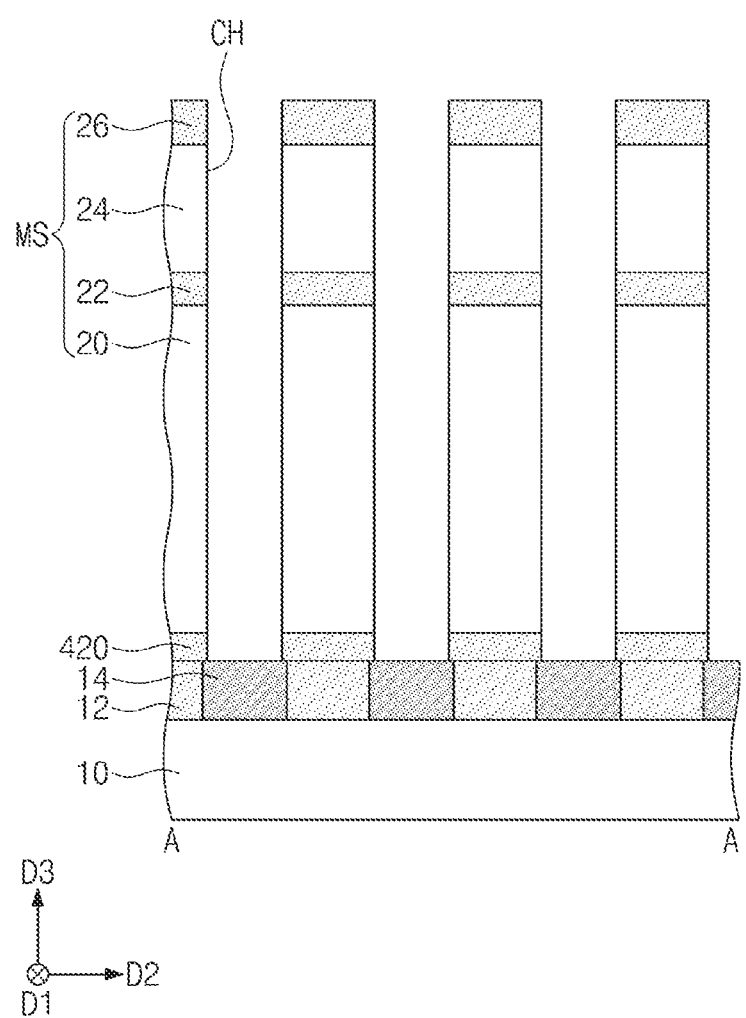

Referring to FIG. 6, the first mask layer 40, the mold structure MS, and the etch stop layer 420L may be anisotropically etched using the second mask pattern 42 as an etch mask. Accordingly, a conductive hole CH may be formed to have the same shape as the first opening OP1. And in some embodiments, a plurality of conductive holes CH may be formed below the first openings OP1, respectively. The conductive hole CH may be formed to penetrate the mold structure MS and the etch stop layer 420L in the third direction D3 and to expose the upper surface of the conductive contact 14. After the etching process, an unetched portion of the etch stop layer 420L may be used as the etch stop pattern 420. In some embodiments, the first mask layer 40 and the second mask pattern 42 may be removed through the etching process. Alternately, the first mask layer 40 and the second mask pattern 42 may be removed by an additional removing process which may be performed after the etching process.

Figure 7:
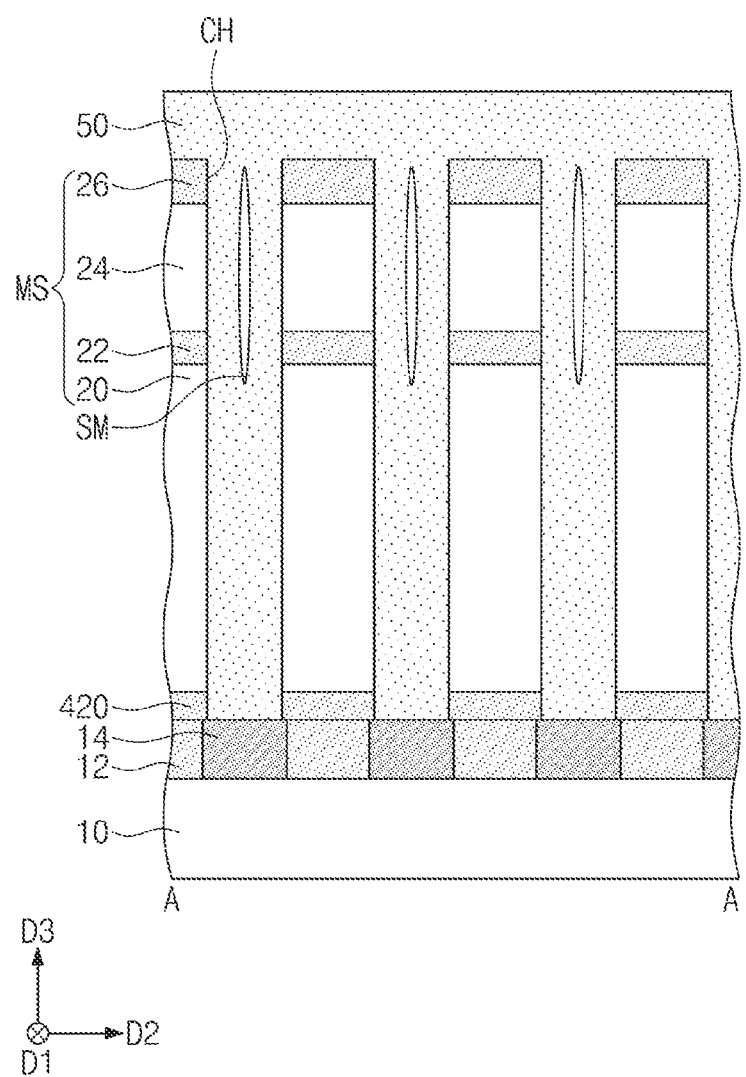

Referring to FIG. 7, a first bottom electrode layer 50 may be formed on the mold structure MS to fill the conductive hole CH. The first bottom electrode layer 50 may cover the exposed upper surface of the conductive contact 14 and the upper supporting layer 26. In some embodiments, the first bottom electrode layer 50 may be formed using a chemical vapor deposition (CVD) process and/or an atomic layer deposition (ALD) process.

The first bottom electrode layer 50 may be formed to fill the conductive holes CH. The first bottom electrode layer 50 may be initially deposited on an inner surface of the conductive hole CH, and as a deposition process goes on, the first bottom electrode layer 50 may be gradually thickened or grown from the inner surface of the conductive hole CH to fill the conductive hole CH. In this case, the seam SM may be formed in the first bottom electrode layer 50. For example, the first bottom electrode layer 50 may have two opposite surfaces which are respectively grown from opposite inner side surfaces of the conductive hole CH, and during the deposition process, the opposite surfaces of the first bottom electrode layer 50 may be grown toward each other to form an interfacial surface or void (i.e., the seam SM). As an example, the seam SM may be an interfacial surface that is formed between the opposite surfaces of the first bottom electrode layer 50. As another example, the seam SM may be an empty space (or void) that is formed in the first bottom electrode layer 50.

The first bottom electrode layer 50 may include at least one of silicon (Si), metallic materials (e.g., cobalt, titanium, nickel, tungsten, and molybdenum), metal nitride materials (e.g., titanium nitride (TiN), titanium silicon nitride (TiSiN), titanium aluminum nitride (TiAlN), tantalum aluminum nitride (TaAlN), and tungsten nitride (WN)), precious metals (e.g., platinum (Pt), ruthenium (Ru), and iridium (Ir)), conductive oxide materials (e.g., PtO, $RuO_2$, $IrO_2$, SRO ($SrRuO_3$), BSRO (($Ba,Sr)RuO_3$), CRO ($CaRuO_3$), and LSCo), or metal silicide materials.

Figure 8:
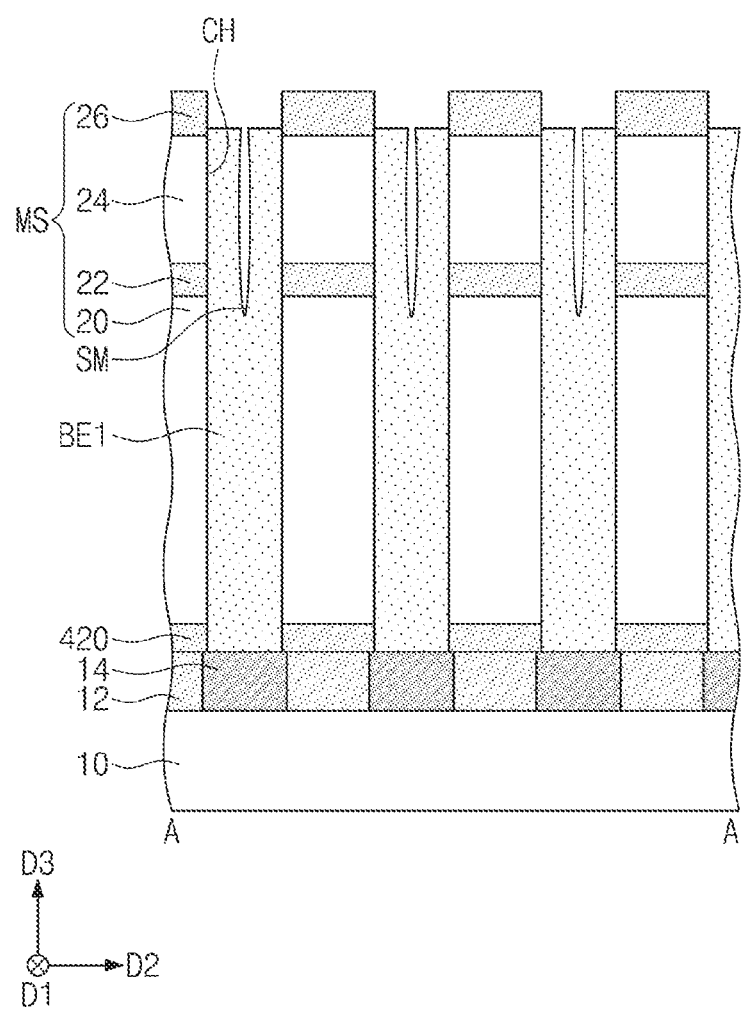

Referring to FIG. 8, the first portion BE1 of the bottom electrode BE may be formed by removing an upper portion of the first bottom electrode layer 50. The first bottom electrode layer 50 may be divided into a plurality of first portions BE1 filling the conductive holes CH, respectively. In some embodiments, the upper portion of the first bottom electrode layer 50 may be removed by an etch-back process. The first portion BE1 may be formed to penetrate the mold structure MS in the third direction D3 and may be electrically connected to the conductive contact 14. As an example, the first portion BE1 may be formed to have a pillar shape. An upper portion of the conductive hole CH may not be filled with the first portion BE1.

Since the upper portion of the first bottom electrode layer 50 is removed, the seam SM may be externally exposed (e.g., exposed to an outside environment). That is, the seam SM may externally exposed the first portion BE1 near an upper surface of the first portion BE1. Here, the upper surface of the first portion BE1 may be disposed at a height lower than an upper surface of the upper supporting layer 26. As an example, the upper surface of the first portion BE1 may be disposed at a height lower than the upper surface of the upper supporting layer 26 and higher than a lower surface of the upper supporting layer 26. Accordingly, the top end of the seam SM may be disposed at a height lower than the upper surface of the upper supporting layer 26 and higher than the lower surface of the upper supporting layer 26. Thus, at least a portion of a side surface of the upper supporting layer 26 may not be covered with the first portion BE1, but may be externally exposed.

Referring to FIG. 9, a second bottom electrode layer 55 may be formed on the first portion BE1. The second bottom electrode layer 55 may fill the upper portion of the conductive hole CH, not filled by the first portion BE1, and may cover the upper supporting layer 26. The top end of the seam SM may be closed by the second bottom electrode layer 55. A portion of a bottom end 55b of the second bottom electrode layer 55 may be exposed to the seam SM. The bottom end 55b of the second bottom electrode layer 55 may contact the upper surface of the first portion BE1 and may be vertically disposed at the same height as the top end of the seam SM.

The second bottom electrode layer 55 may include at least one of silicon (Si), metallic materials (e.g., cobalt, titanium, nickel, tungsten, and molybdenum), metal nitride materials (e.g., titanium nitride (TiN), titanium silicon nitride (TiSiN), titanium aluminum nitride (TiAlN), tantalum aluminum nitride (TaAlN), and tungsten nitride (WN)), precious metals (e.g., platinum (Pt), ruthenium (Ru), and iridium (Ir)), conductive oxide materials (e.g., PtO, $RuO_2$, $IrO_2$, SRO ($SrRuO_3$), BSRO (($Ba,Sr)RuO_3$), CRO ($CaRuO_3$), and LSCo), or metal silicide materials. The second bottom electrode layer 55 may include at least one of the same material(s) as the first portion BE1 and may further include a material not included in the first portion BE1.

Referring to FIG. 10, the bottom electrode BE may be formed by removing an upper portion of the second bottom electrode layer 55. Here, the bottom electrode BE may include the first and second portions BE1 and BE2, which are sequentially and vertically stacked. The second portion BE2 may be formed by removing the upper portion of the second bottom electrode layer 55. That is, the second bottom electrode layer 55 may be divided into a plurality of second portions BE2 filling the conductive holes CH, respectively. In some embodiments, the upper portion of the second bottom electrode layer 55 may be removed by an etch-back process. Since the upper portion of the second bottom electrode layer 55 is removed, the upper surface of the upper supporting layer 26 and a portion of the side surface of the upper supporting layer 26 may be externally exposed.

The top end BEa of the second portion BE2 may be disposed at a height lower than the upper surface of the upper supporting layer 26. A portion of the bottom end BEb of the second portion BE2 may be exposed to the seam SM. The bottom end BEb of the second portion BE2 may be disposed at the same height as the top end of the seam SM. The first and second portions BE1 and BE2 may contact each other without material interface therebetween.

Figure 12:
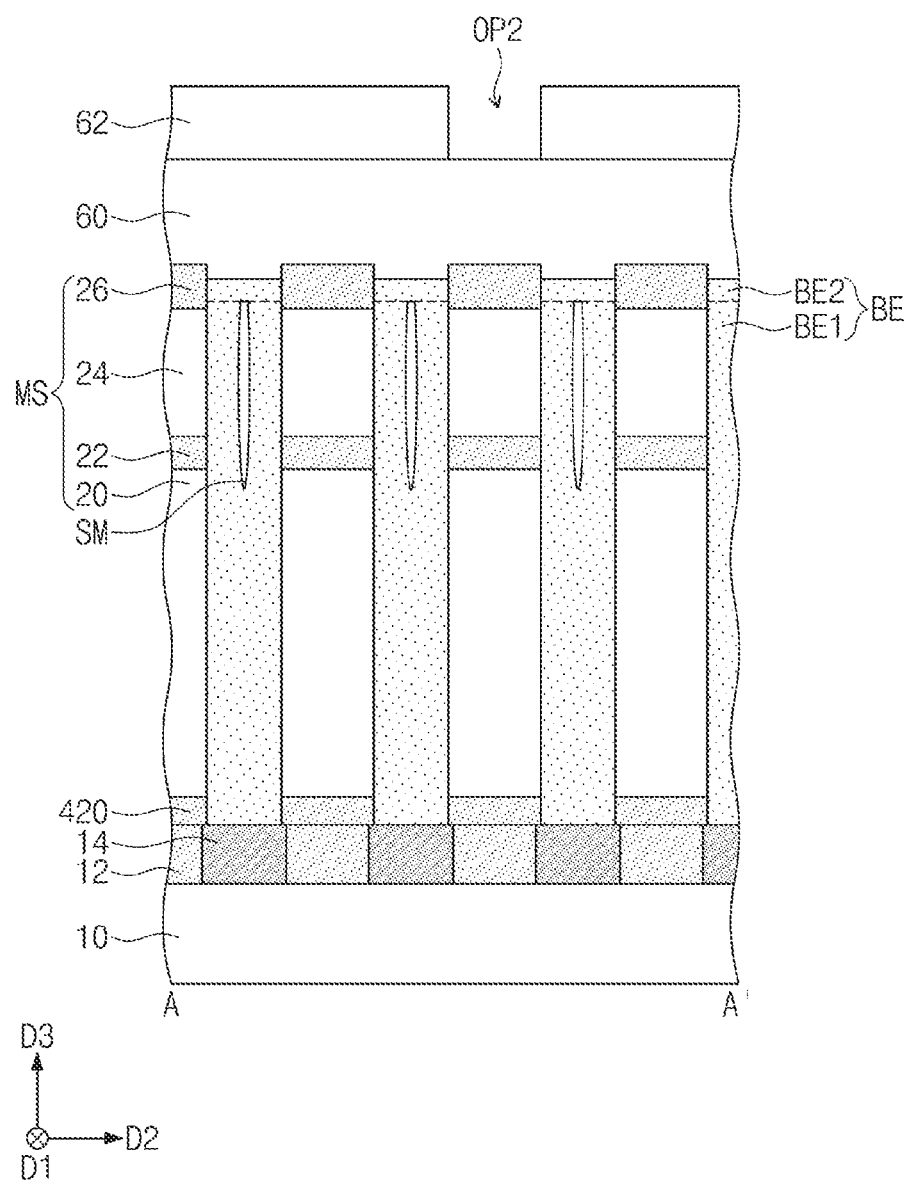

Referring to FIGS. 11 and 12, a third mask layer 60 and a fourth mask pattern 62 may be sequentially formed on the mold structure MS and the bottom electrode BE. The third mask layer 60 may cover the upper supporting layer 26 and the bottom electrode BE. The fourth mask pattern 62 may be formed on the third mask layer 60 and may have a second opening OP2. In some embodiments, a plurality of second openings OP2 may be provided. The second opening OP2 may be formed to expose a portion of an upper surface of the third mask layer 60. The third mask layer 60 may include, for example, polysilicon. In some embodiments, the fourth mask pattern 62 may include a photoresist material.

Figure 13:
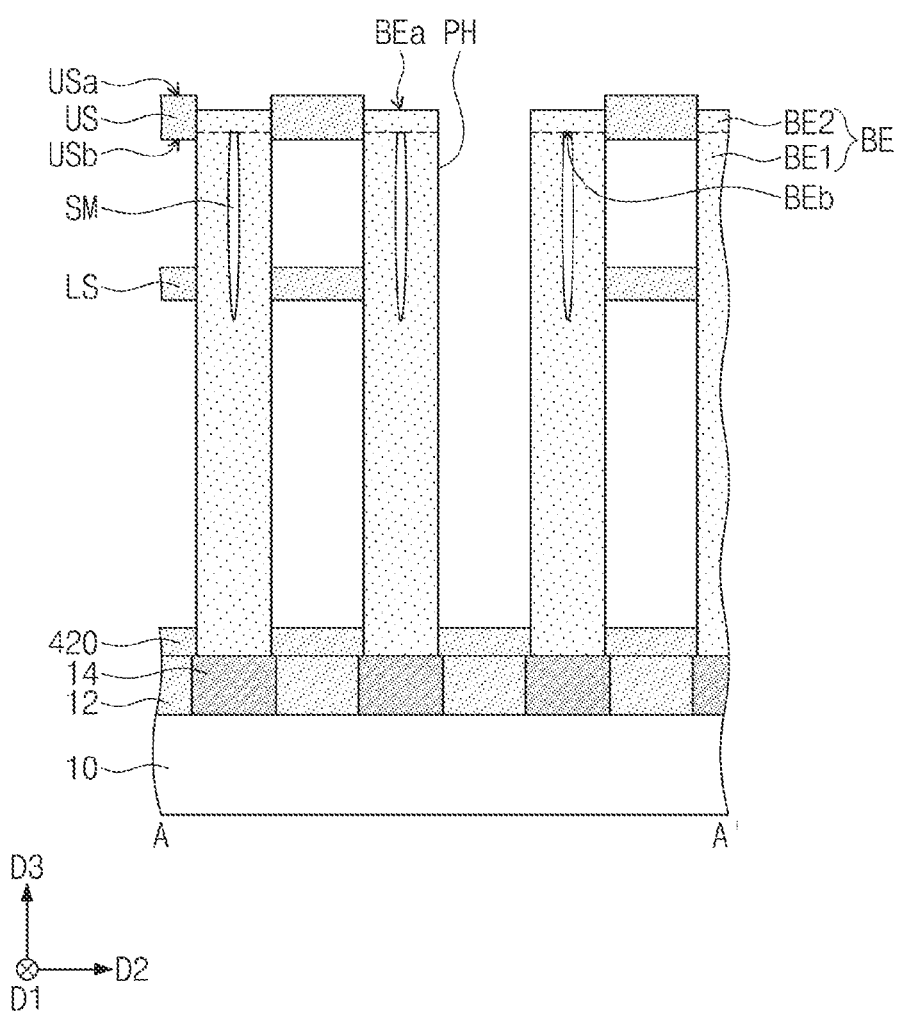

Referring to FIG. 13, the third mask layer 60 and the upper supporting layer 26 may be anisotropically etched using the fourth mask pattern 62 as an etch mask. Accordingly, a portion of the third mask layer 60 and a portion of the upper supporting layer 26, which are vertically overlapped with the second opening OP2, may be removed. A remaining portion of the upper supporting layer 26 may be used as the upper supporting pattern US. The penetration hole PH may penetrate the upper supporting pattern US. In some embodiments, a plurality of penetration holes PH may be formed, and each of the penetration holes PH may be vertically overlapped with a corresponding one of the second openings OP2. The penetration hole PH may be formed to expose a portion of an upper surface of the second mold layer 24.

The second mold layer 24 may now be removed. Accordingly, a lower surface of the upper supporting pattern US, a portion of a side surface of the bottom electrode BE, and an upper surface of the lower supporting layer 22 may be exposed. The process of removing the second mold layer 24 may include an isotropic etching process. In some embodiments, the isotropic etching process may be performed using phosphoric acid ($H_3PO_4$). As an example, a remaining portion of the third mask layer 60 may be removed before the process of removing the second mold layer 24, but the inventive concept is not limited to this example. As a result of the removal of the second mold layer 24, the penetration hole PH may extend to the upper surface of the lower supporting layer 22.

A portion of an upper surface of the first mold layer 20 may be exposed by etching a portion of the lower supporting layer 22, which is vertically overlapped with the penetration hole PH. A remaining portion of the lower supporting layer 22 may be used as the lower supporting pattern LS. The penetration hole PH may extend into the lower supporting pattern LS to pass through the lower supporting pattern LS.

Thereafter, the first mold layer 20 may be removed. Accordingly, a lower surface of the lower supporting pattern LS, a remaining portion of the side surface of the bottom electrode BE, and an upper surface of the etch stop pattern 420 may be exposed. The process of removing the first mold layer 20 may include an isotropic etching process. In some embodiments, the isotropic etching process may be performed using phosphoric acid ($H_3PO_4$).

According to embodiments of the inventive concept, it is possible to prevent or suppress the bottom electrode BE from being damaged during the process of removing the first and second mold layers 20 and 24. Due to the second portion BE2 of the bottom electrode BE, the seam SM of the bottom electrode BE may not be externally exposed, and thus, etching solution for an isotropic etching process may be prevented from infiltrating into the bottom electrode BE through the seam SM. That is, since the first and second portions BE1 and BE2 of the bottom electrode BE are separately formed, it is possible to suppress damage to the bottom electrode BE, which may otherwise be caused by a subsequent etching process. Accordingly, it may be possible to improve the electrical performance and overall reliability of semiconductor devices according to embodiments of the inventive concept.

Referring to FIG. 2, the dielectric layer DL may be formed on the upper supporting pattern US, the lower supporting pattern LS, the bottom electrode BE, and the etch stop pattern 420. The dielectric layer DL may conformally cover the upper supporting pattern US, the lower supporting pattern LS, the bottom electrode BE, and the etch stop pattern 420. The dielectric layer DL may be formed to fill a portion of the penetration hole PH.

The dielectric layer DL, which contacts the bottom electrode BE, may be formed to have a crystal structure that is substantially the same or similar to that of the bottom electrode BE. For example, the dielectric layer DL may be formed to have a tetragonal structure. The dielectric layer DL may be formed using a deposition process (e.g., CVD or ALD process) having good step coverage.

The top electrode TE may be formed on the dielectric layer DL. The top electrode TE may be formed to fill a remaining portion of the penetration hole PH and to cover the bottom electrode BE. The top electrode TE may be formed to fill spaces between adjacent ones of the bottom electrodes BE, between the upper and lower supporting patterns US and LS, and between the lower supporting pattern LS and the etch stop pattern 420. As a result of the formation of the top electrode TE, the dielectric layer DL may be interposed between the bottom electrode BE and the top electrode TE. The bottom electrode BE, the dielectric layer DL, and the top electrode TE may constitute the capacitor CA.

Figure 14:
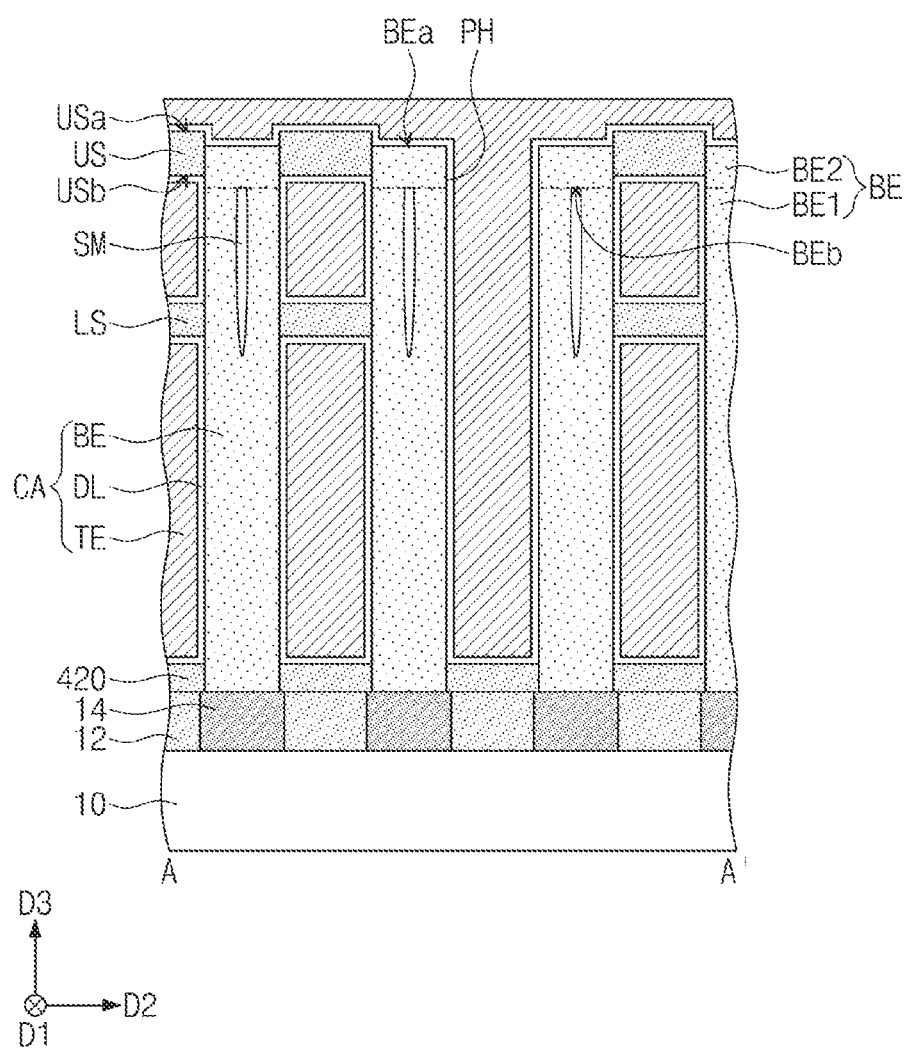
FIG. 14 is a cross-sectional view taken along the line A-A' of FIG. 1.

FIG. 14 is a cross-sectional view taken along line A-A' of FIG. 1 and further illustrates a semiconductor device according to still other embodiments of the inventive concept.

Referring to FIG. 14, the top end of the seam SM may be disposed at a height lower than the lower surface USb of the upper supporting pattern US. Accordingly, the bottom end BEb of the second portion BE2 of the bottom electrode BE may be disposed at a height lower than the lower surface USb of the upper supporting pattern US. An upper surface of the bottom electrode BE (e.g., the top end BEa of the second portion BE2) may be disposed at a height lower than the upper surface USa of the upper supporting pattern US and higher than the lower surface USb of the upper supporting pattern US. Thus, the bottom electrode BE may be supported by the upper supporting pattern US.

Figure 15:
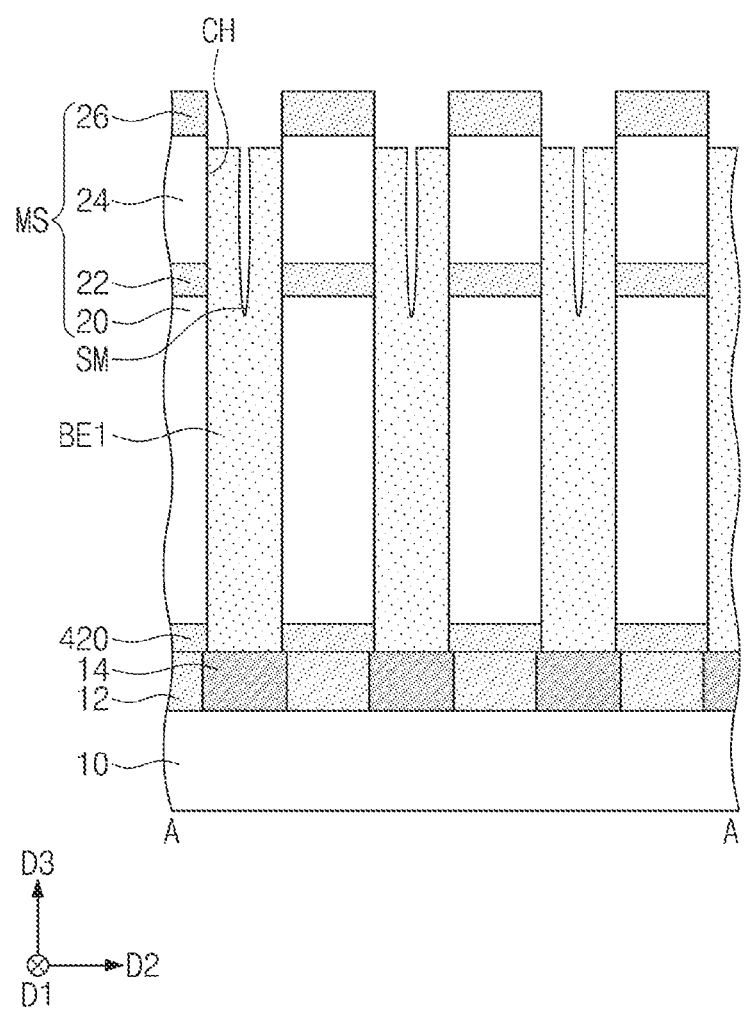
FIGS. 15, 16 and 17 are related cross-sectional views illustrating a method of manufacture for the semiconductor device of FIG. 14.
Figure 16:
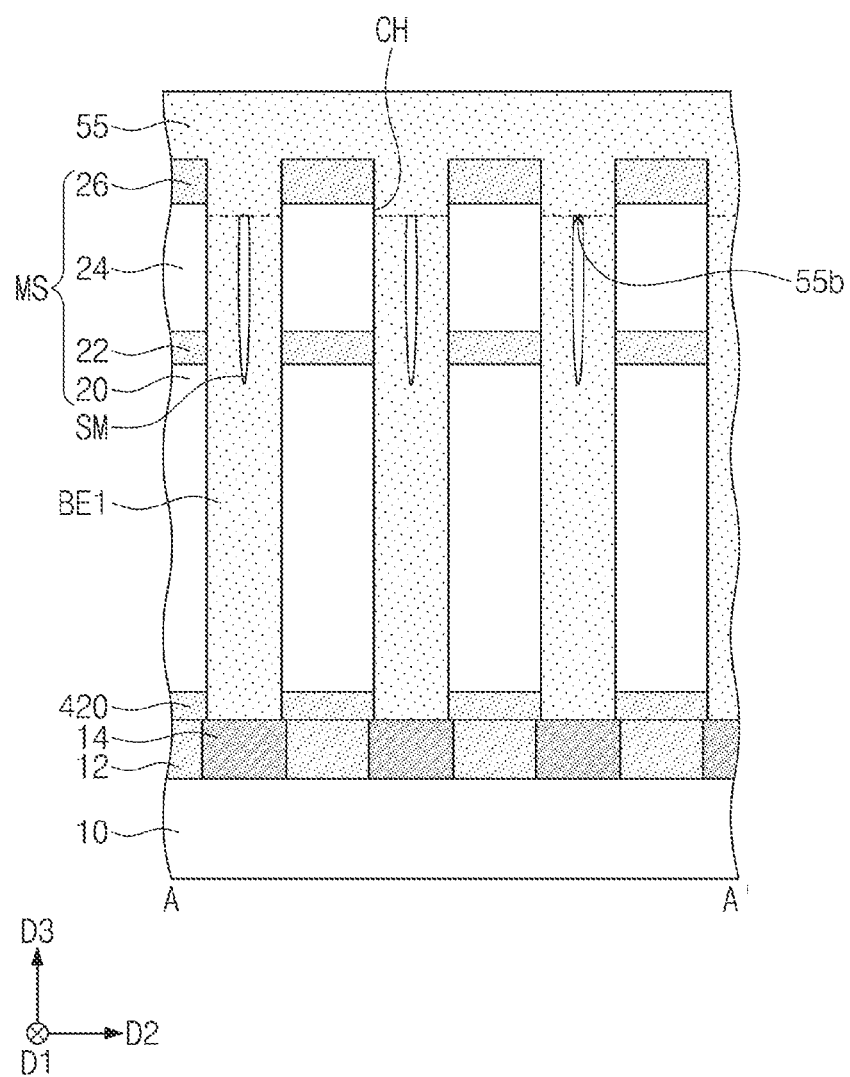
Figure 17:
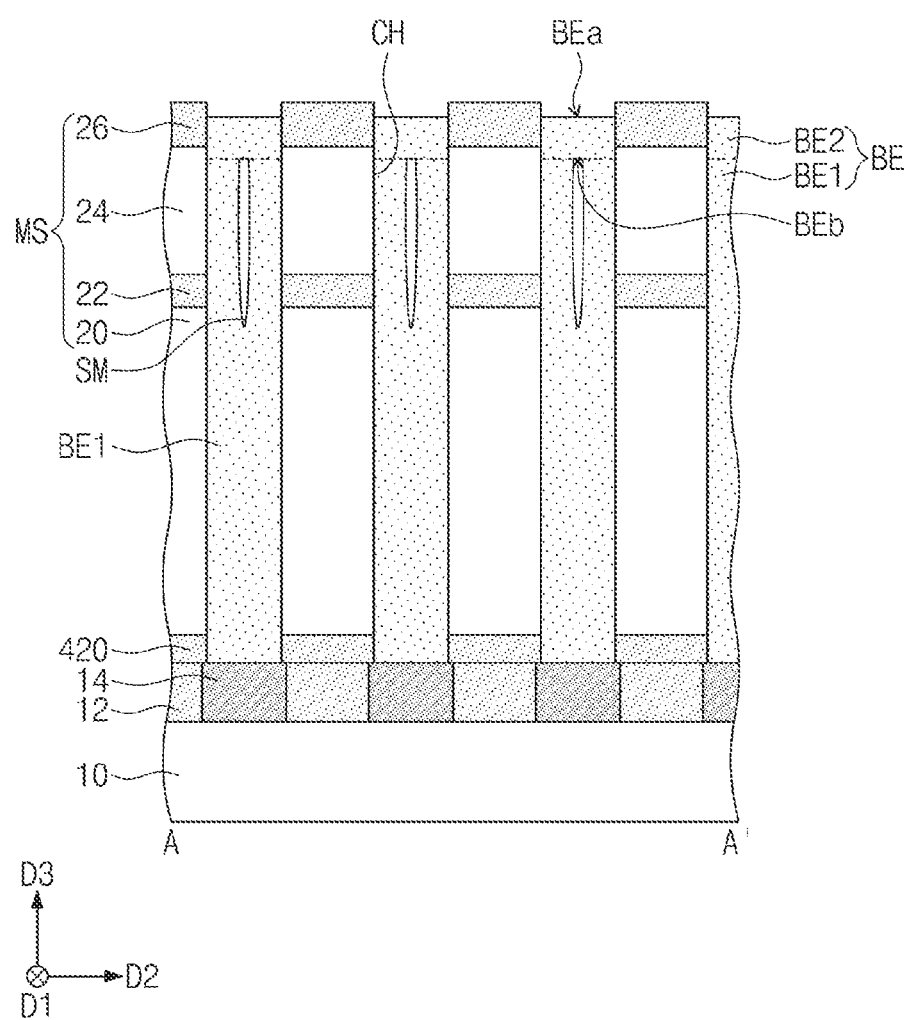

FIGS. 15, 16 and 17 are related cross-sectional views illustrating a method of manufacture the semiconductor device of FIG. 14.

Referring to FIGS. 7 and 15, the first portion BE1 of the bottom electrode BE may be formed by removing an upper portion of the first bottom electrode layer 50. Since the upper portion of the first bottom electrode layer 50 is removed, the seam SM may be externally exposed. The seam SM may exposed the first portion BE1 near an upper surface of the first portion BE1. The upper surface of the first portion BE1 may be disposed at a height lower than the lower surface of the upper supporting layer 26. Accordingly, the top end of the seam SM may be disposed at a height lower than the lower surface of the upper supporting layer 26. A side surface of the upper supporting layer 26 may not be covered with the first portion BE1.

Referring to FIG. 16, the second bottom electrode layer 55 may be formed on the first portion BE1. The top end of the seam SM may be closed-off by the formation of the second bottom electrode layer 55, and a portion of the bottom end 55b of the second bottom electrode layer 55 may be exposed to the seam SM. The bottom end 55b of the second bottom electrode layer 55 may contact the upper surface of the first portion BE1 and be disposed at the same height as the top end of the seam SM. That is, the bottom end 55b of the second bottom electrode layer 55 may be disposed at a height lower than the lower surface of the upper supporting layer 26.

Referring to FIG. 17, the bottom electrode BE may be formed by removing an upper portion of the second bottom electrode layer 55. Here, the bottom electrode BE may include the first and second portions BE1 and BE2 which are sequentially stacked. An upper surface of the bottom electrode BE (e.g., the top end BEa of the second portion BE2) may be disposed at a height lower than the upper surface of the upper supporting layer 26, and a portion of a bottom end BEb of the second portion BE2 may be exposed to the seam SM. The bottom end BEb of the second portion BE2 may be disposed at the same height as the top end of the seam SM. That is, the bottom end BEb of the second portion BE2 may be disposed at a height lower than the lower surface of the upper supporting layer 26. The first and second portions BE1 and BE2 may contact each other without material interface therebetween. Thereafter, the method of manufacture described in relation to FIGS. 2 and 11, 12 and 13 may be performed to complete the semiconductor device of FIG. 14.

Figure 18:
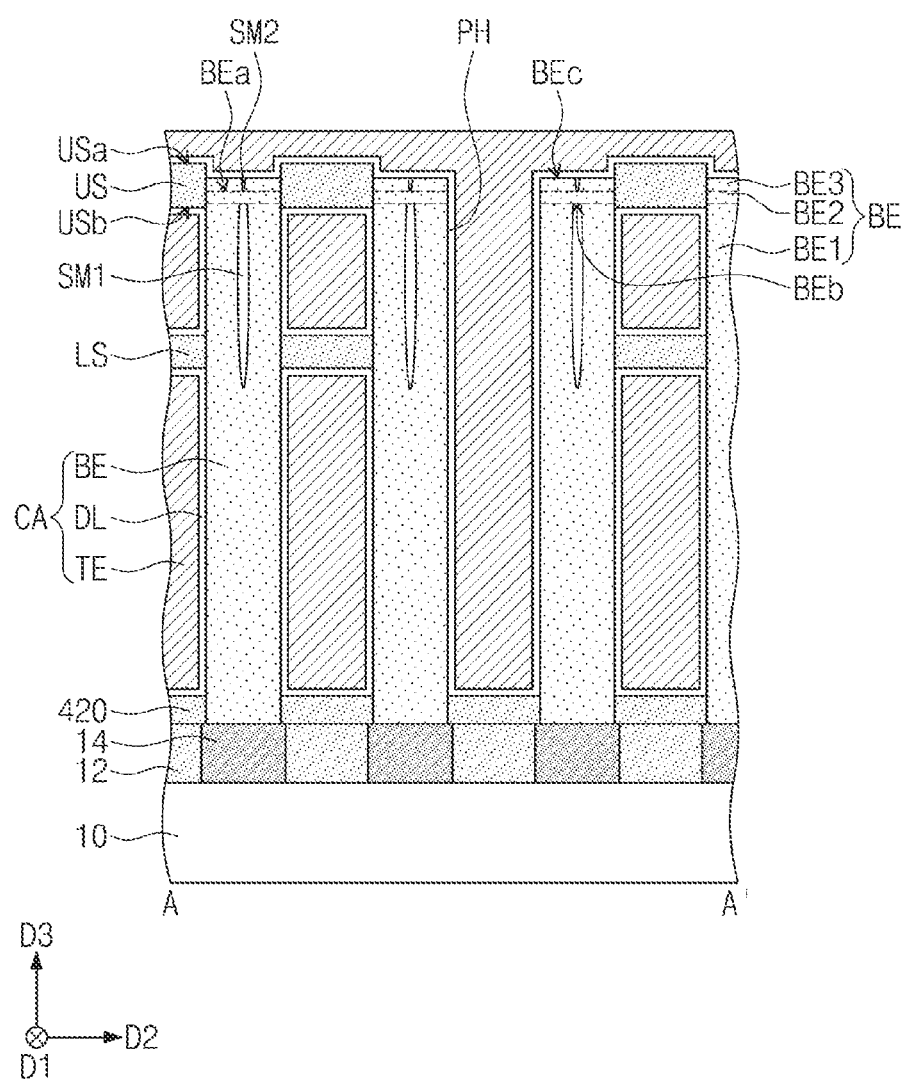
FIG. 18 is a cross-sectional view taken along the line A-A' of FIG. 1.

FIG. 18 is a cross-sectional view taken along line A-A' of FIG. 1 and illustrates a semiconductor device according to still other embodiments of the inventive concept.

Referring to FIG. 18, the bottom electrode BE may include a first portion BE1, a second portion BE2, and a third portion BE3, which are sequentially provided on the substrate 10 in the third direction D3. A first seam SM1 may be formed in the first portion BE1, and a second (or another) seam SM2 may be formed in the third portion BE3. Although not shown in FIG. 18, one or more seams SM may be formed in the first portion BE1 at different heights. In such a case, the first seam SM1 may be an uppermost one of the seams SM in the first portion BE1. The second seam SM2 may penetrate the third portion BE3 in the third direction D3.

The second portion BE2 may be disposed between the first and third portions BE1 and BE3. The second portion BE2 may be a portion of the bottom electrode BE disposed on a top end of the first seam SM1 and under a bottom end of the second seam SM2. The bottom end BEb of the second portion BE2 may be disposed at the same height as the top end of the first seam SM1, and the top end BEa of the second portion BE2 may be disposed at the same height as the bottom end of the second seam SM2. A portion of the bottom end BEb of the second portion BE2 may be exposed to the first seam SM1, and a portion of the top end BEa of the second portion BE2 may be exposed to the second seam SM2.

A top end BEc of the third portion BE3 may be disposed at a height lower than the upper surface USa of the upper supporting pattern US and higher than the lower surface USb of the upper supporting pattern US. Accordingly, the bottom electrode BE may be supported by the upper supporting pattern US.

As illustrated in FIG. 18, the top end BEa and the bottom end BEb of the second portion BE2 may be disposed at a height higher than the lower surface USb of the upper supporting pattern US. Alternately, the top end BEa of the second portion BE2 may be disposed at a height higher than the lower surface USb of the upper supporting pattern US, and the bottom end BEb of the second portion BE2, and at a height lower than the lower surface USb of the upper supporting pattern US. Alternately, the top end BEa and the bottom end BEb of the second portion BE2 may be disposed at a height lower than the lower surface USb of the upper supporting pattern US. Here, the third portion BE3 may include at least one of the same material(s) as the second portion BE2.

The dielectric layer DL may be provided to cover (or contact) the top end BEc of the third portion BE3 (i.e., the upper surface of the bottom electrode BE). The dielectric layer DL may be partially exposed to the second seam SM2. That is, the dielectric layer DL may cover the second seam SM2.

Figure 19:
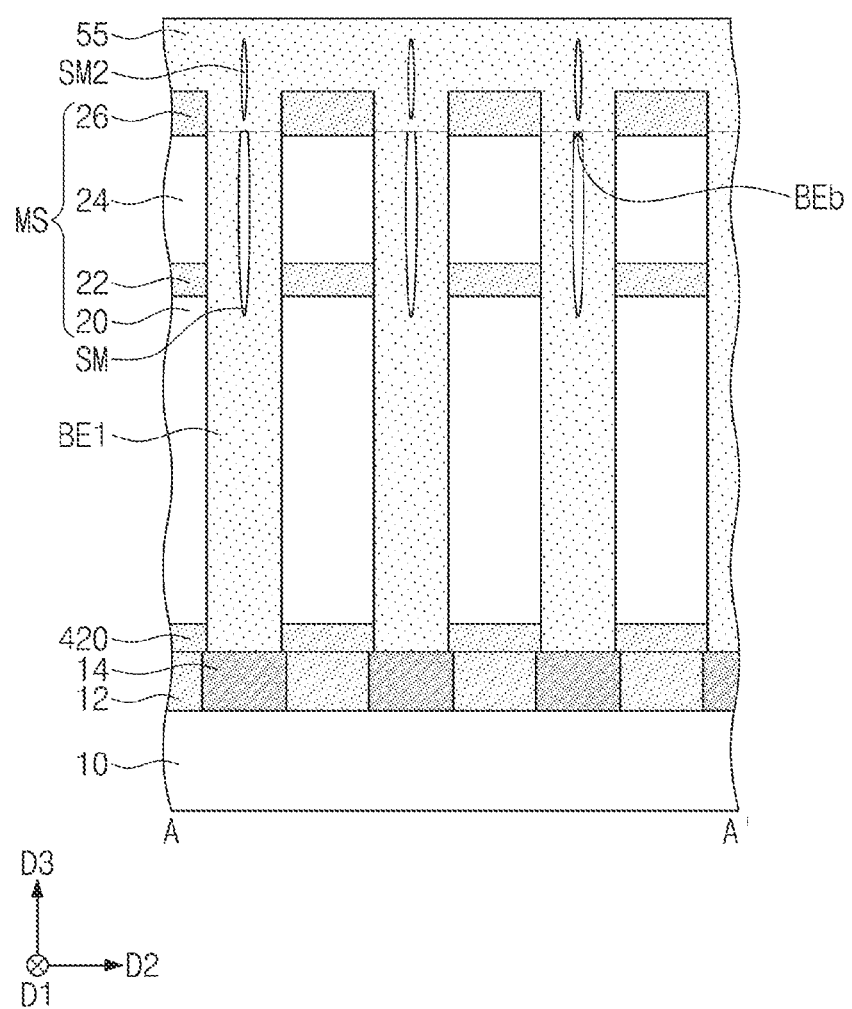
FIGS. 19 and 20 are related cross-sectional views illustrating a method of manufacture for the semiconductor device of FIG. 18.
Figure 20:
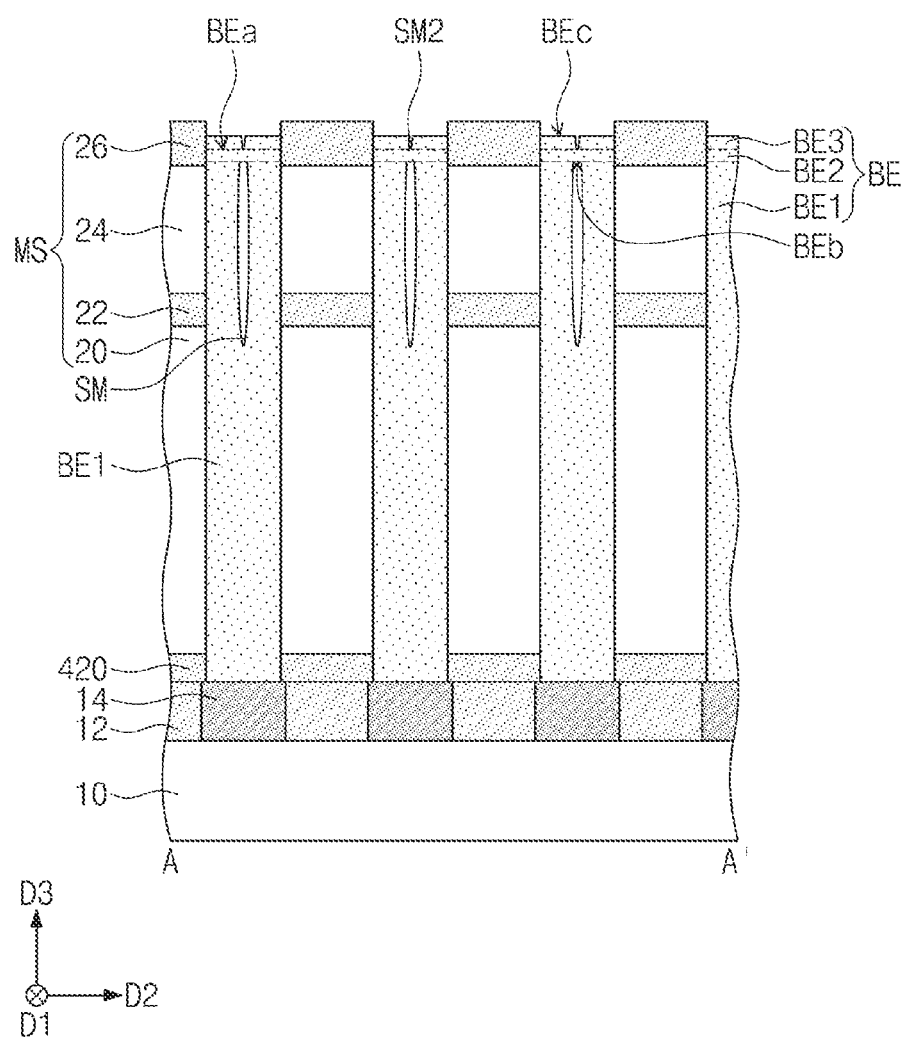

FIGS. 19 and 20 are related cross-sectional views illustrating a method of manufacture for the semiconductor device of FIG. 18.

Referring to FIG. 19, when the second bottom electrode layer 55 is formed, the second seam SM2 may be formed in the second bottom electrode layer 55. The second seam SM2 may be formed above the first seam SM1. For example, the second seam SM2 may be an empty region (or void) that is sealed by the bottom electrode layer 55, as shown in FIG. 19. Alternately, the second seam SM2 may externally exposed the second bottom electrode layer 55 near an upper surface of the second bottom electrode layer 55.

Referring to FIG. 20, the bottom electrode BE may be formed by removing an upper portion of the second bottom electrode layer 55. The bottom electrode BE may include the first portion BE1, the second portion BE2 on the first portion BE1, and the third portion BE3 on the second portion BE2. An upper surface of the bottom electrode BE (e.g., the top end BEc of the third portion BE3) may be disposed at a height that is lower than the upper surface of the upper supporting layer 26 and higher than the lower surface of the upper supporting layer 26.

A portion of the top end BEa of the second portion BE2 may be exposed to the second seam SM2. The top end BEa of the second portion BE2 may be disposed at the same height as a bottom end of the second seam SM2. A portion of the bottom end BEb of the second portion BE2 may be exposed to the first seam SM1. The bottom end BEb of the second portion BE2 may be disposed at the same height as a top end of the first seam SM1. As illustrated in FIG. 20, the bottom end BEb of the second portion BE2 may be disposed at a height higher than the lower surface of the upper supporting layer 26. Alternately, the bottom end BEb of the second portion BE2 may be disposed at a height lower than the lower surface of the upper supporting layer 26.

The second seam SM2 may externally exposed the bottom electrode BE near the upper surface of the bottom electrode BE (e.g., the top end BEc of the third portion BE3). Accordingly, etching solution used during a subsequent etching process might infiltrate into the bottom electrode BE through the second seam SM2. However, due to the second portion BE2, the second seam SM2 may not extend to a lower portion of the bottom electrode BE, and thus, it is possible to reduce the possibility of damage to the bottom electrode BE caused by an infiltrating etching solution.

The first and second portions BE1 and BE2 may contact each other without material interface therebetween, and the second and third portions BE2 and BE3 may contact each other without material interface therebetween. Thereafter, the method of manufacture described in relation to FIGS. 2, 11, 12 and 13 may be performed to complete the semiconductor device of FIG. 18.

Figure 21:
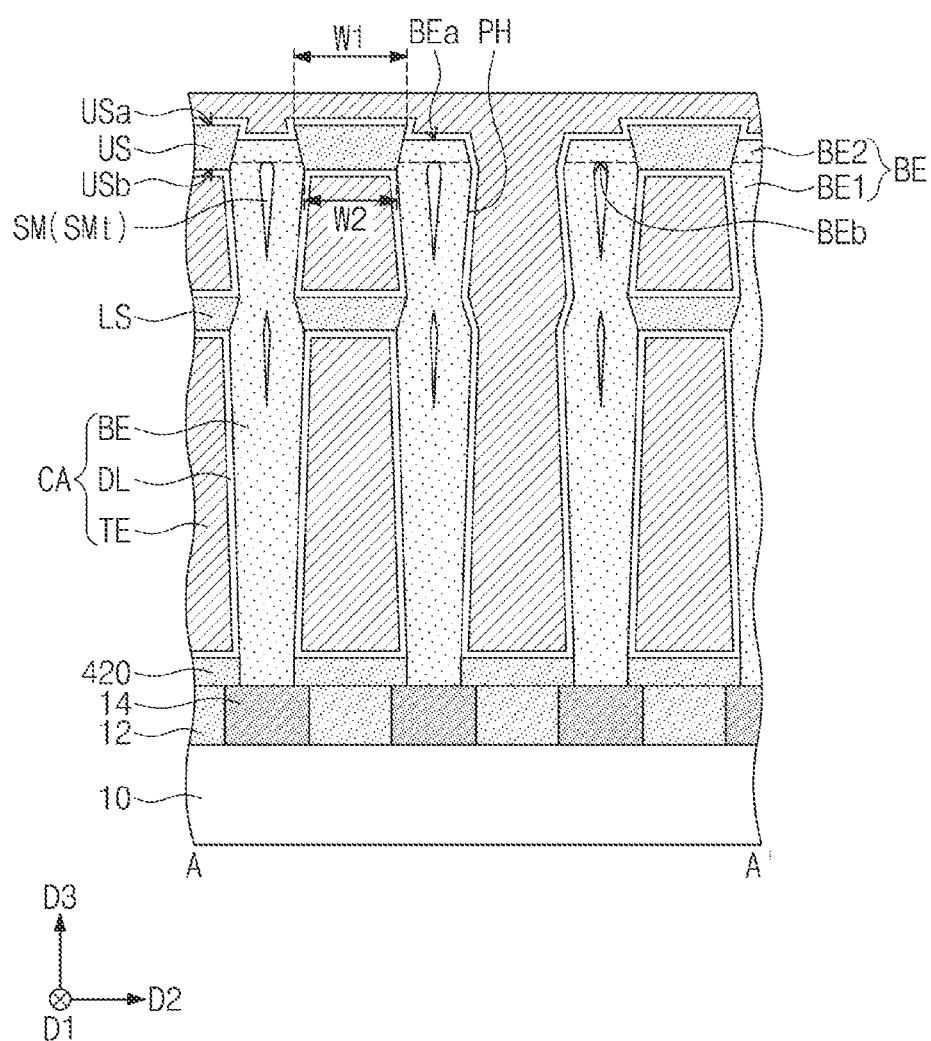
FIG. 21 is a cross-sectional view taken along the line A-A' of FIG. 1.

FIG. 21 is a cross-sectional view taken along line A-A' of FIG. 1 and illustrates a semiconductor device according to still other embodiments of the inventive concept.

Referring to FIG. 21, a first width W1 of the upper surface USa of the upper supporting pattern US in the second direction D2 may be different from a second width W2 of the lower surface USb of the upper supporting pattern US in the second direction D2. That is, as illustrated in FIG. 21, the first width W1 may be greater than the second width W2.

Alternately, the first width W1 may be less than the second width W2. A width of an upper surface of the lower supporting pattern LS may be different from a width of a lower surface of the lower supporting pattern LS.

A portion of a side surface of the bottom electrode BE may contact a side surface of the upper supporting pattern US and a side surface of the lower supporting pattern LS. The contacting portion of the side surface of the bottom electrode BE may have a profile corresponding to that of the side surfaces of the upper and lower supporting patterns US and LS. Due to the profile of the side surfaces of the upper and lower supporting patterns US and LS, the seam SM may be provided in the bottom electrode BE. For example, the upper seam SMt may be provided adjacent to the upper supporting pattern US.

Other portions of the side surface of the bottom electrode BE (e.g., portions not contacting the upper and lower supporting patterns US and LS) may be provided with various profiles. For example, as illustrated in FIG. 21, non-contacting portions of the side surface of the bottom electrode BE may linearly extend in a direction crossing the second and third directions D2 and D3. Alternately, non-contacting portions of the side surface of the bottom electrode BE may have a bumpy (or uneven) shape extending in the third direction D3, however, the inventive concept is not limited thereto.

FIGS. 22, 23, 24, 25 and 26 are related cross-sectional views illustrating a method of manufacture for the semiconductor device of FIG. 21.

Figure 22:
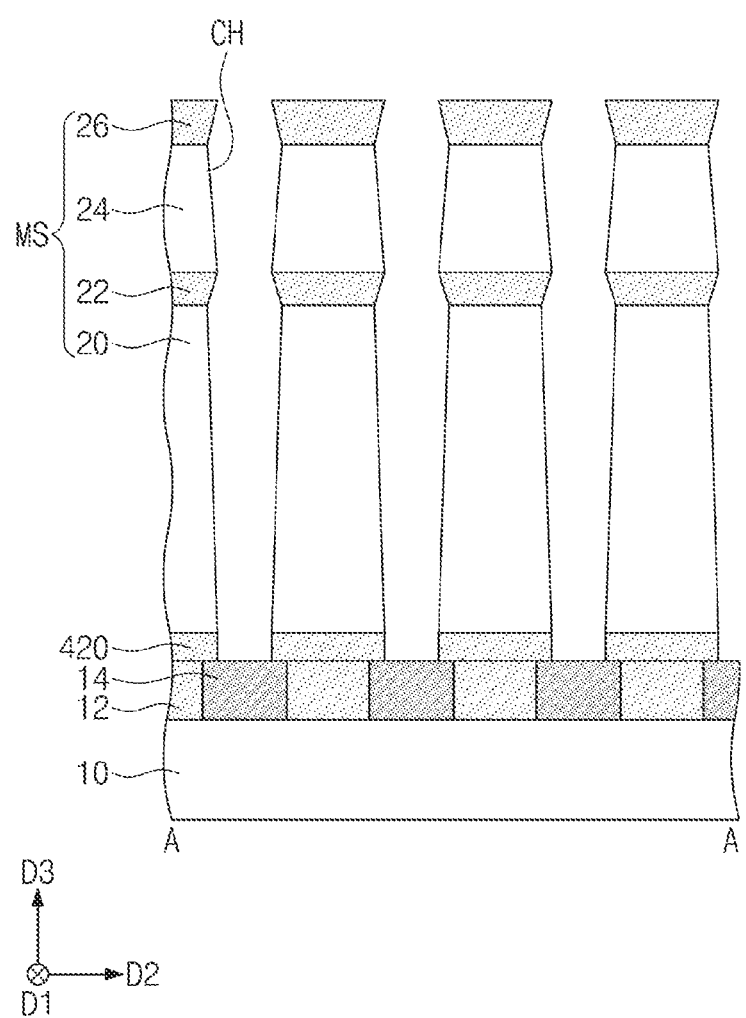
FIGS. 22, 23, 24, 25 and 26 are related cross-sectional views illustrating a method of manufacture for the semiconductor device of FIG. 21.

Referring to FIGS. 5 and 22, the conductive hole CH may be formed to sequentially penetrate the upper supporting layer 26, the second mold layer 24, the lower supporting layer 22, and the first mold layer 20 of the mold structure MS. The conductive hole CH may be formed by an anisotropic etching process using the second mask pattern 42 as an etch mask. Widths of the first and second mold layers 20 and 24 and the lower and upper supporting layers 22 and 26 in the second direction D2 may vary in accordance with heights. For example, a width of the upper surface of the upper supporting layer 26 may be greater than a width of the lower surface of the upper supporting layer 26. The profile of the side surfaces of the first and second mold layers 20 and 24 and the lower and upper supporting layers 22 and 26 may vary by design.

Figure 23:
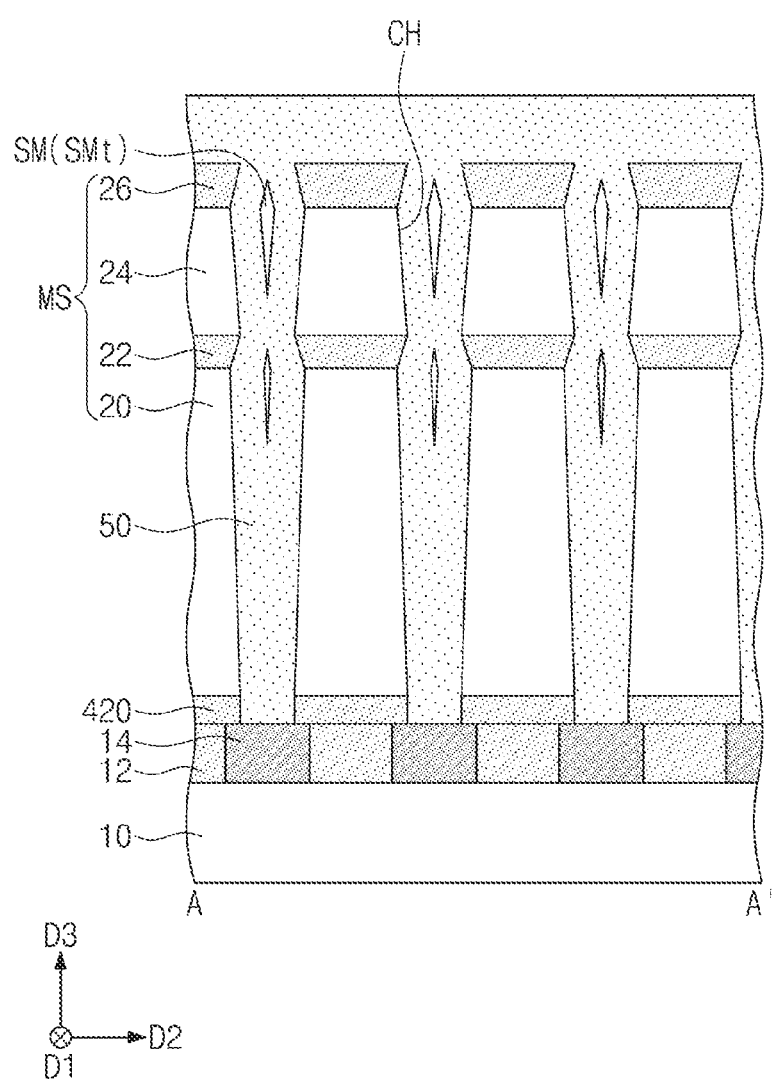

Referring to FIG. 23, the first bottom electrode layer 50 may be formed on the mold structure MS to fill the conductive hole CH. The seam SM may be formed in the first bottom electrode layer 50, and the position and shape of the seam SM may depend on the profile of the side surface of the conductive hole CH. For example, due to the afore-described profile of the side surface of the upper supporting layer 26, the upper seam SMt may be formed near the upper supporting layer 26.

Figure 24:
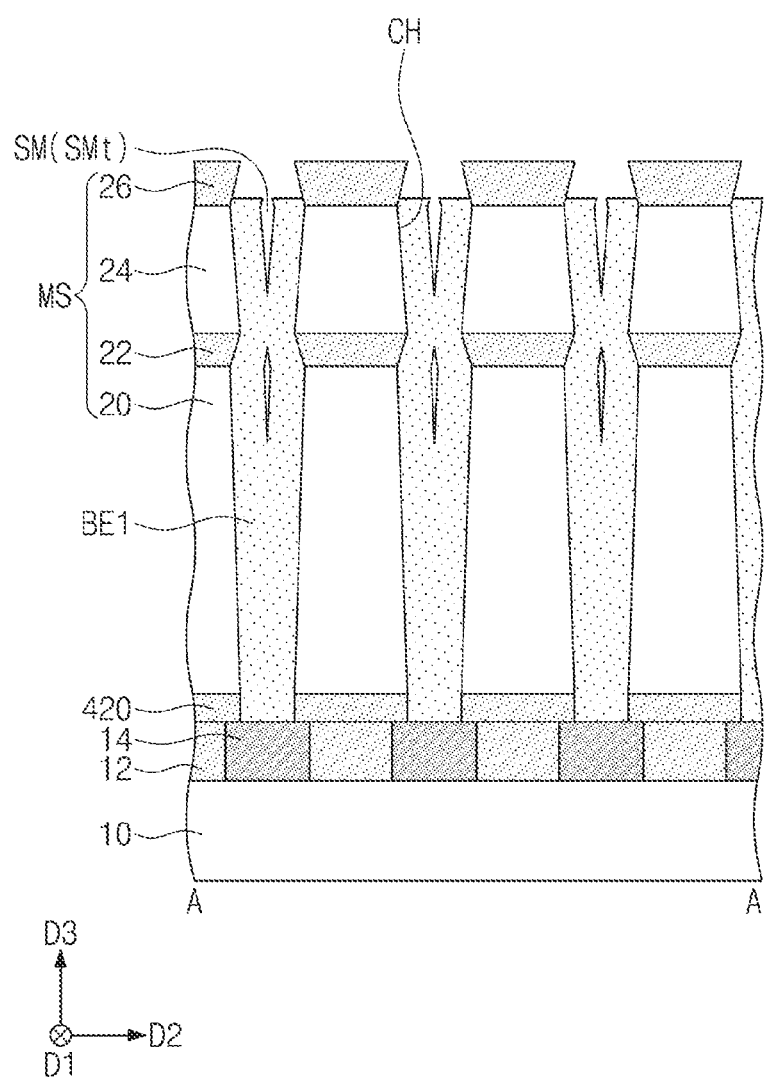

Referring to FIG. 24, the first portion BE1 of the bottom electrode BE may be formed by removing an upper portion of the first bottom electrode layer 50. The first bottom electrode layer 50 may be divided into a plurality of first portions BE1 filling the conductive holes CH, respectively. Since the upper portion of the first bottom electrode layer 50 is removed, the upper seam SMt may be externally exposed. The upper seam SMt may be externally exposed near an upper surface of the first portion BE1. A top end of the upper seam SMt may be disposed at a height lower than the upper surface of the upper supporting layer 26.

Figure 25:
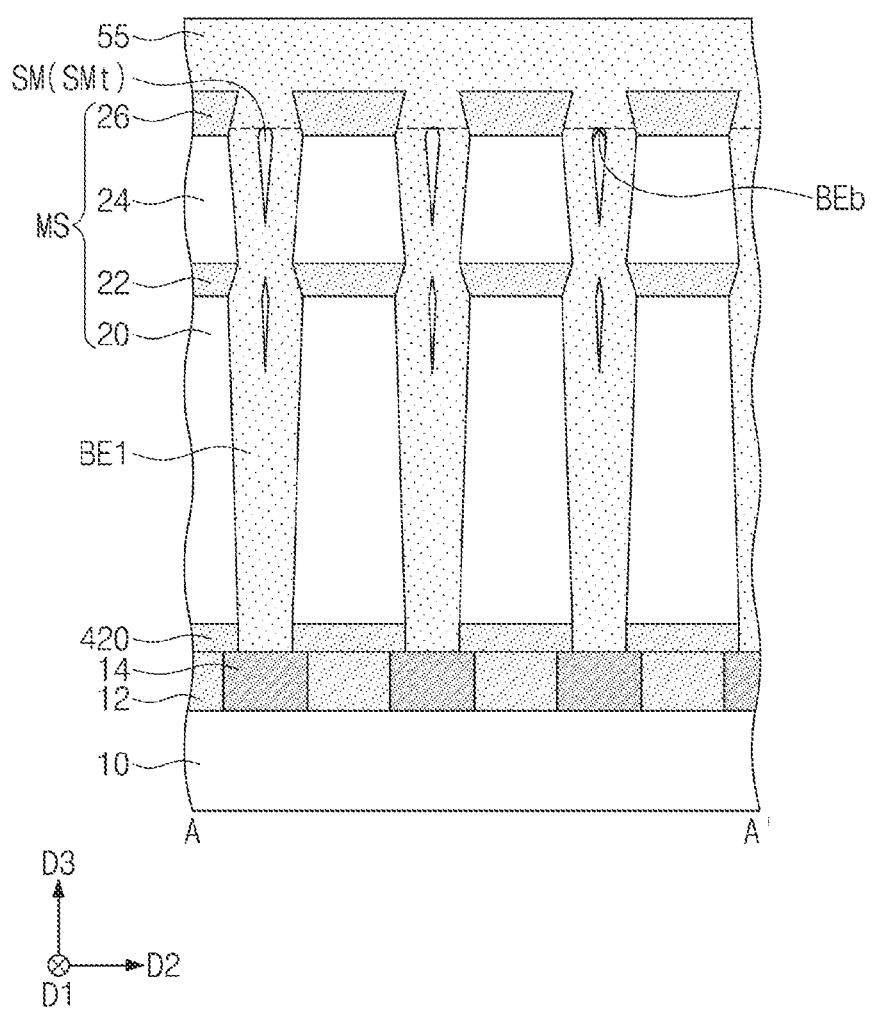

Referring to FIG. 25, the second bottom electrode layer 55 may be formed on the first portion BE1. The second bottom electrode layer 55 may fill the upper portion of the conductive hole CH not filled with the first portion BEL and may cover the upper supporting layer 26. The top end of the upper seam SMt may be closed or sealed by the second bottom electrode layer 55. A portion of the bottom end 55b of the second bottom electrode layer 55 may be exposed to the upper seam SMt. The bottom end 55b of the second bottom electrode layer 55 contact the upper surface of the first portion BE1 and may be disposed at the same height as the top end of the upper seam SMt.

Figure 26:
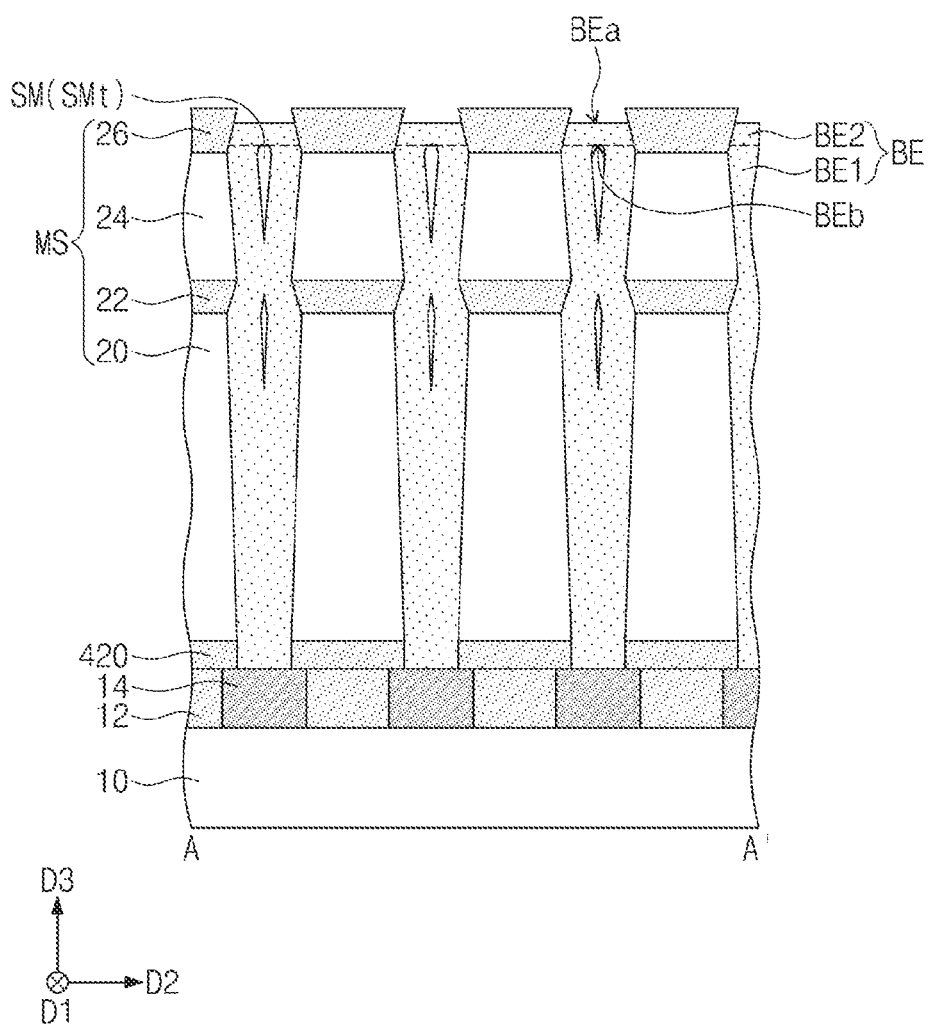

Referring to FIG. 26, the bottom electrode BE may be formed by removing an upper portion of the second bottom electrode layer 55. The bottom electrode BE may include the first and second portions BE1 and BE2, which are sequentially stacked. That is, the second portion BE2 may be formed by removing the upper portion of the second bottom electrode layer 55. A side surface of the bottom electrode BE may be formed to have a profile corresponding to the side surfaces of the first and second mold layers 20 and 24 and the lower and upper supporting layers 22 and 26.

Referring to FIG. 21, the dielectric layer DL may be formed on the upper supporting pattern US, the lower supporting pattern LS, the bottom electrode BE, and the etch stop pattern 420. The dielectric layer DL may conformally cover the upper supporting pattern US, the lower supporting pattern LS, the bottom electrode BE, and the etch stop pattern 420. The top electrode TE may be formed on the dielectric layer DL. The top electrode TE may be formed to fill a remaining portion of the penetration hole PH and to cover the bottom electrode BE. As a result of the formation of the top electrode TE, the dielectric layer DL may be interposed between the bottom electrode BE and the top electrode TE. Here, a combination of the bottom electrode BE, the dielectric layer DL, and the top electrode TE may constitute the capacitor CA.

Figure 27:
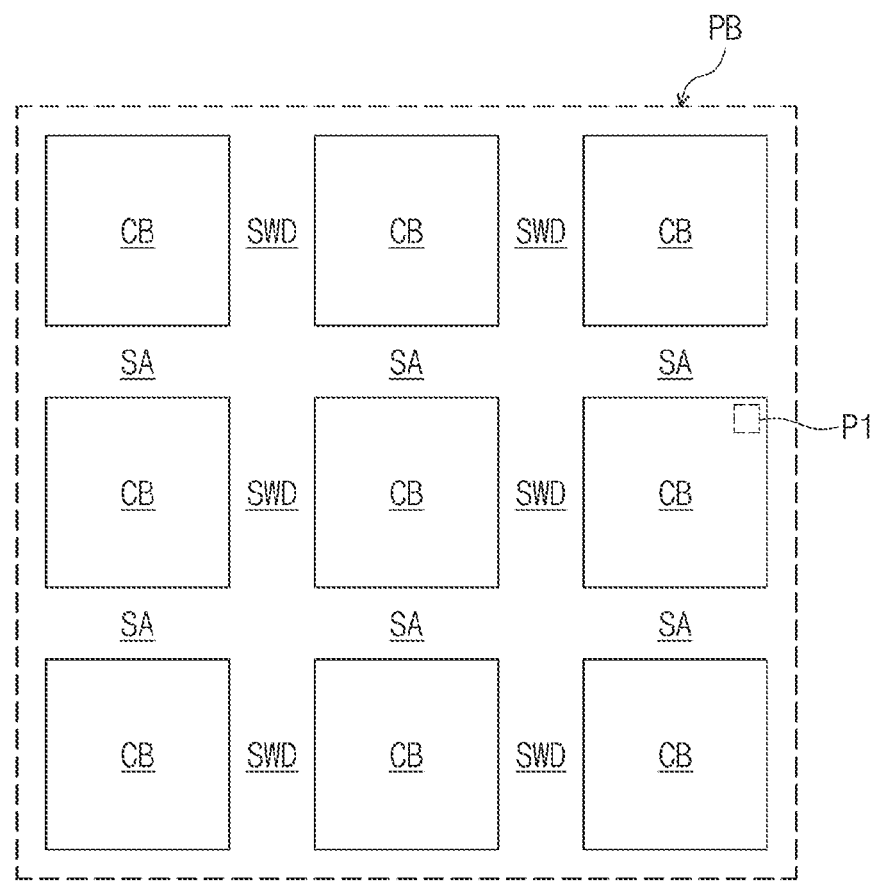
FIG. 27 is a block diagram illustrating a semiconductor device according to embodiments of the inventive concept.
Figure 28:
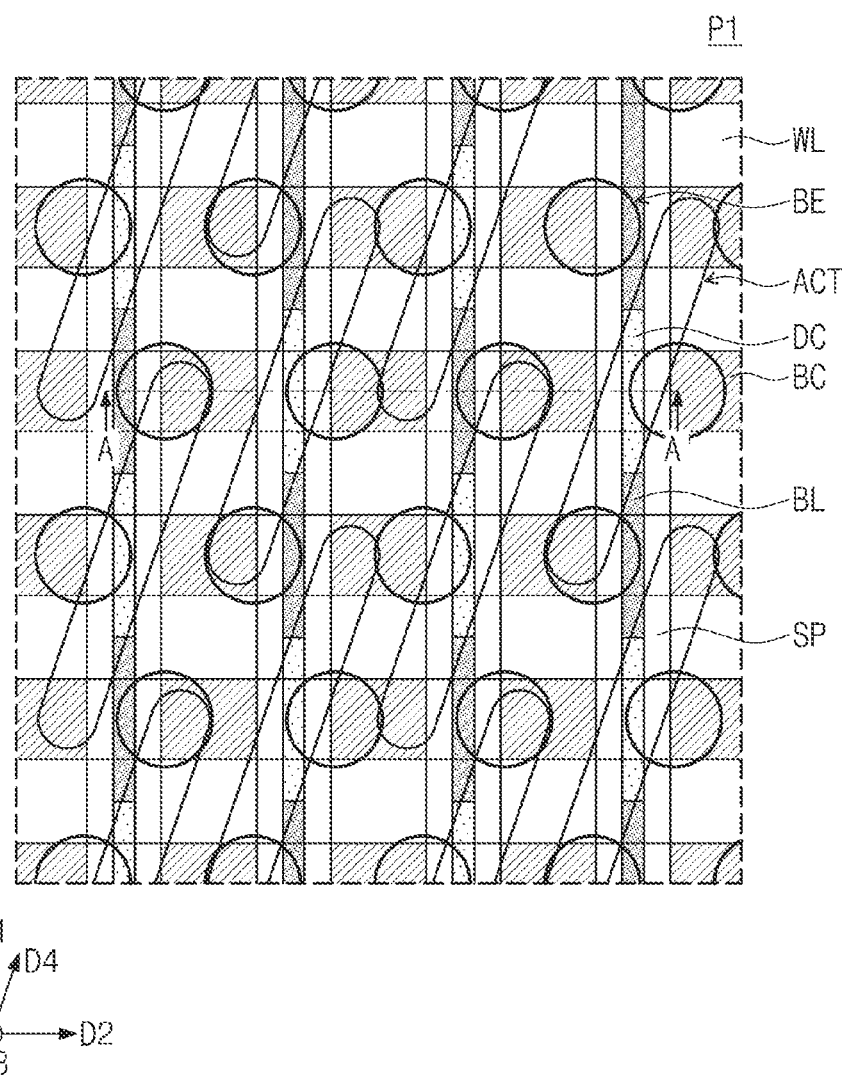
FIG. 28 is an enlarged plan view further illustrating a portion 'P1' indicted in FIG. 27.
Figure 29:
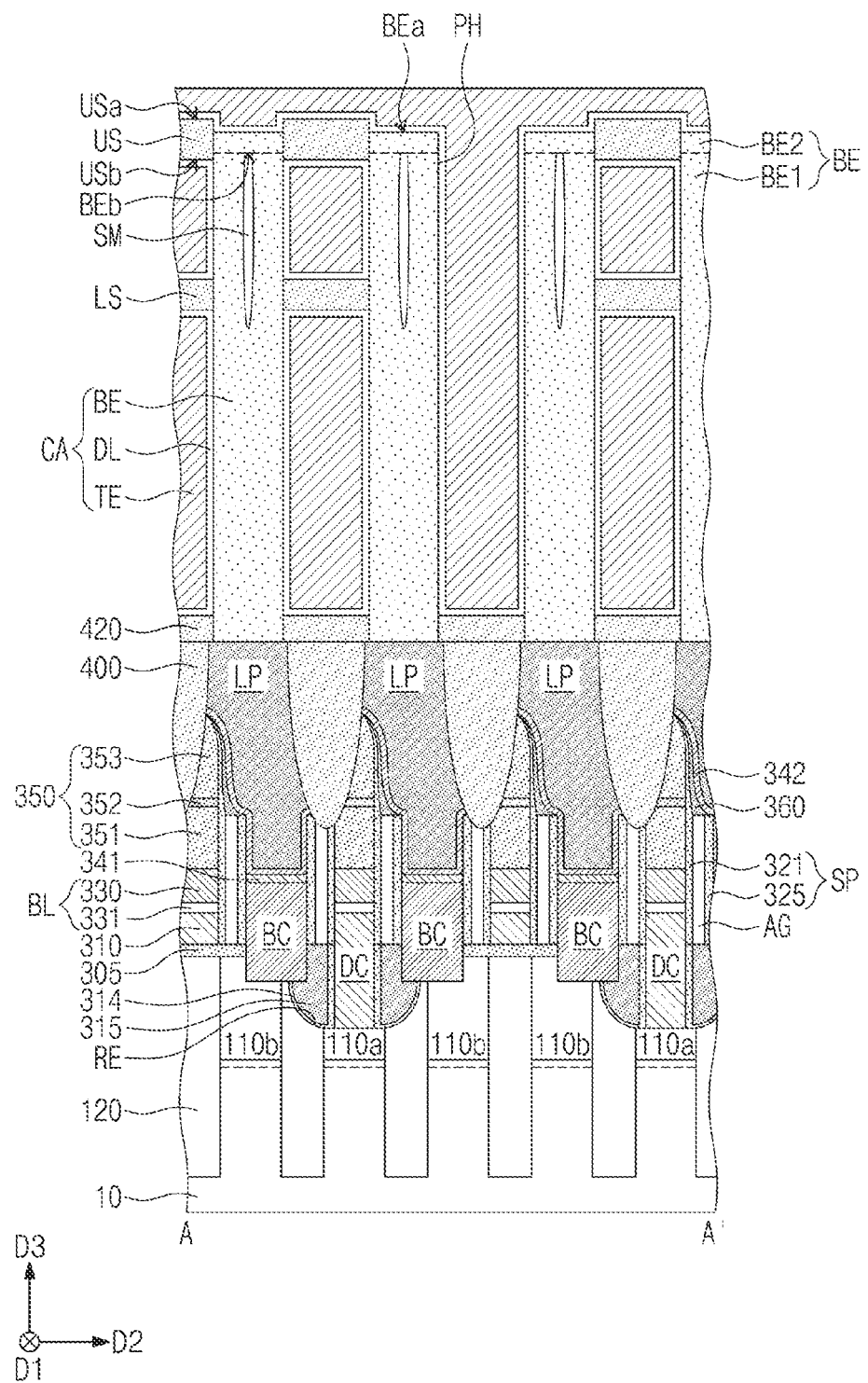
FIG. 29 is a cross-sectional view taken along line A-A' of FIG. 28.

FIG. 27 is a block diagram illustrating a semiconductor device according to embodiments of the inventive concept; FIG. 28 is an enlarged plan view illustrating a portion 'P1' indicated in FIG. 27; and FIG. 29 is a sectional view taken along line A-A' of FIG. 28.

Referring to FIG. 27, the semiconductor device may include cell blocks CB and a peripheral block PB that encloses (or encompasses) the cell blocks CB. Here, in some embodiments, the semiconductor device may be a memory device, and each of the cell blocks CB may include a memory cell circuit (e.g., a memory integrated circuit). The cell blocks CB may be spaced apart in the first direction D1 and the second direction D2.

The peripheral block PB may include peripheral circuits (e.g., sense amplifier circuits SAs, sub-word line driver circuits SWD, etc.) variously used to operate the memory cell circuit(s). Thus, the peripheral circuits may be electrically connected to the one or more of the memory cell circuit(s).

In some embodiments, the sense amplifier circuits SA may be provided to face each other with the cell blocks CB interposed therebetween, and the sub-word line driver circuits SWD may be provided to face each other with the cell blocks CB interposed therebetween. The peripheral block PB may further include power and ground circuits that may be used to drive a sense amplifier, but the inventive concept is not limited thereto.

Referring to FIGS. 28 and 29, a substrate 10 (e.g., a silicon substrate, a germanium substrate, or a silicon-germanium substrate) including a cell region may be provided. That is, the cell region may be a region of the substrate 10 in which each cell block CB of FIG. 27 is provided.

Active patterns ACT may be disposed on the cell region of the substrate 10. Here, the active patterns ACT may be spaced apart in the first and second directions D1 and D2. The active patterns ACT may be formed in bar-shaped patterns extending in a fourth direction D4 substantially parallel to the upper surface of the substrate 10 and angularly disposed in relation to the first and second directions D1 and D2. An end portion of one of the active patterns ACT may be disposed near a center of another active pattern ACT adjacent thereto in the second direction D2. Each of the active patterns ACT may be a protruding portion of the substrate 10 extending from the substrate 10 in the third direction D3.

Device isolation layers 120 may be disposed between the active patterns ACT. The device isolation layers 120 may be disposed in the substrate 10 to define the active patterns ACT. The device isolation layers 120 may include at least one of silicon oxide, silicon nitride, and/or silicon oxynitride.

Word lines WL may be disposed in the substrate 10 to cross the active patterns ACT and the device isolation layers 120. The word lines WL may be disposed in grooves, which are formed in the active patterns ACT and the device isolation layers 120. The word lines WL may extend in the second direction D2 and may be spaced apart in the first direction D1. The word lines WL may be buried in the substrate 10.

Impurity regions may be provided in the active patterns ACT. The impurity regions may include first impurity regions 110a and second impurity regions 110b. The second impurity regions 110b may be respectively provided in opposite end portions of each of the active patterns ACT. Each of the first impurity regions 110a may be formed in a portion (e.g., between the second impurity regions 110b) of a corresponding one of the active patterns ACT. The first and second impurity regions 110a and 110b may contain impurities of the same conductivity type (e.g., N-type).

A buffer pattern 305 may be disposed on the cell region of the substrate 10. The buffer pattern 305 may cover the active patterns ACT, the device isolation layers 120, and the word lines WL. The buffer pattern 305 may include at least one of silicon oxide, silicon nitride, and/or silicon oxynitride.

Bit lines BL may be disposed on the substrate 10. The bit lines BL may extend in the first direction D1 and may be spaced apart in the second direction D2. Each of the bit lines BL may include a first ohmic pattern 331 and a metal-containing pattern 330, which are sequentially stacked. The first ohmic pattern 331 may include at least one of metal silicide materials. The metal-containing pattern 330 may include at least one of metallic materials (e.g., tungsten, titanium, tantalum, and so forth).

Polysilicon patterns 310 may be interposed between the bit lines BL and the buffer pattern 305.

Bit line contacts DC may be respectively interposed between the bit lines BL and the first impurity regions 110a. The bit lines BL may be electrically connected to the first impurity regions 110a by the bit line contacts DC. The bit line contacts DC may include doped or undoped polysilicon.

The bit line contacts DC may be disposed in a recess region RE. The recess region RE may be provided in upper portions of the first impurity regions 110a and the device isolation layers 120, which are adjacent to each other. A first gap-fill insulating pattern 314 and a second gap-fill insulating pattern 315 may be provided to fill a remaining portion of the recess region RE.

A bit line capping pattern 350 may be provided on an upper surface of each of the bit lines BL. The bit line capping pattern 350 may be provided on each of the bit lines BL to extend in the first direction D1, and adjacent ones of the bit line capping pattern 350 may be spaced apart in the second direction D2. The bit line capping pattern 350 may include a first bit line capping pattern 351, a second bit line capping pattern 352, and a third bit line capping pattern 353. The bit line capping pattern 350 may include silicon nitride. For example, the first bit line capping pattern 351, the second bit line capping pattern 352, and the third bit line capping pattern 353 may include silicon nitride.

A bit line spacer SP may be provided to cover a side surface of each of the polysilicon patterns 310, an upper side surface of each of the bit line contacts DC, a side surface of each of the bit lines BL, and a side surface of the bit line capping pattern 350. The bit line spacer SP may extend along each of the bit lines BL or in the first direction D1.

The bit line spacer SP may include a first sub-spacer 321 and a second sub-spacer 325, which are spaced apart. In some embodiments, the first sub-spacer 321 and the second sub-spacer 325 may be spaced apart by an air gap AG. The first sub-spacer 321 may be provided to be in contact with the side surface of each of the bit lines BL and may extend to cover the side surface of the bit line capping pattern 350. The second sub-spacer 325 may be provided along a side surface of the first sub-spacer 321. The first and second sub-spacers 321 and 325 may include at least one of silicon nitride, silicon oxide, or silicon oxynitride and may have a single- or multi-layered structure. The first and second sub-spacers 321 and 325 may include at least one of the same material(s).

A fourth capping pattern 360 may be provided to cover the side surface of the first sub-spacer 321 and may extend to cover an upper surface of the second sub-spacer 325. The fourth capping pattern 360 may further cover the air gap AG.

Storage node contacts BC may be provided on the substrate 10 and may be interposed between adjacent ones of the bit lines BL. The bit line spacer SP may be interposed between the storage node contacts BC and the bit lines BL which are spaced apart. The storage node contacts BC may be spaced apart in the first and second directions D1 and D2. Each of the storage node contacts BC may be electrically connected to a corresponding one of the second impurity regions 110b. The storage node contacts BC may include doped or undoped polysilicon.

A second ohmic pattern 341 may be disposed on each of the storage node contacts BC. The second ohmic pattern 341 may include at least one of metal silicide materials.

A diffusion-prevention pattern 342 may be provided to conformally cover the second ohmic pattern 341, the bit line spacer SP, and the bit line capping pattern 350. The diffusion-prevention pattern 342 may include at least one of metal nitride materials (e.g., titanium nitride and tantalum nitride). The second ohmic pattern 341 may be interposed between the diffusion-prevention pattern 342 and each of the storage node contacts BC.

Landing pads LP may be disposed on the storage node contacts BC, respectively. Each of the landing pads LP may be electrically connected to a corresponding one of the storage node contacts BC. The landing pads LP may include at least one of metal-containing materials (e.g., tungsten). An upper portion of the landing pad LP may be shifted from the storage node contact BC in the second direction D2. Here, the landing pads LP may be spaced apart in the first and second directions D1 and D2. For example, the landing pads LP may be spaced apart in the first and second directions D1 and D2, or may be arranged in a zigzag pattern. Each of the landing pads LP may correspond to the conductive contact 14 of FIG. 2.

A filling pattern 400 may be provided to enclose each of the landing pads LP. The filling pattern 400 may be interposed between adjacent ones of the landing pads LP. For example, the filling pattern 400 may include at least one of silicon nitride, silicon oxide, or silicon oxynitride. As another example, the filling pattern 400 may include an empty region (or void). The filling pattern 400 may correspond to the interlayer insulating layer 12 of FIG. 2.

The etch stop pattern 420 may be disposed on the filling pattern 400. The etch stop pattern 420 may expose upper surfaces of the landing pads LP. The bottom electrode BE may be disposed on the landing pad LP. In some embodiments, a plurality of bottom electrodes BE may be provided, and each of the bottom electrodes BE may be disposed on a corresponding one of the landing pads LP. The bottom electrode BE may be electrically connected to the corresponding one of the landing pads LP.

At least one supporting pattern may be provided on the substrate 10. The supporting pattern may include the upper and lower supporting patterns US and LS, which are spaced apart in the third direction D3. The supporting pattern may be interposed between adjacent ones of the bottom electrodes BE.

The top electrode TE may cover the bottom electrode BE and the supporting pattern. The dielectric layer DL may be interposed between the bottom electrode BE and the top electrode TE and between the supporting pattern and the top electrode TE. The bottom electrode BE, the dielectric layer DL, and the top electrode TE may constitute the capacitor CA. The capacitor CA may correspond to the capacitor CA of the semiconductor device described above. That is, the bottom electrode BE, the dielectric layer DL, and the top electrode TE may be configured to have the same features as those in one of the previous embodiments.

According to embodiments of the inventive concept, a bottom electrode of a capacitor may include a first portion and a second portion, and the second portion may be used to prevent or suppress the bottom electrode from being damaged by an infiltrating etching solution used during a subsequent etching process. Accordingly, it may be possible to improve electrical performance and overall reliability of semiconductor devices.

While example embodiments of the inventive concept have been particularly shown and described, it will be understood by one of ordinary skill in the art that variations in form and detail may be made therein without departing from the scope of the attached claims.

What is claimed is:

1. A semiconductor device, comprising:
a bottom electrode on a substrate;
a supporting pattern between the bottom electrode and an adjacent bottom electrode;
a top electrode covering the bottom electrode and the supporting pattern; and
a dielectric layer between the bottom electrode and the top electrode and between the supporting pattern and the top electrode,
wherein the bottom electrode includes a first portion including a seam and a second portion on the first portion,
a top end of the second portion is disposed at a height lower than an upper surface of the supporting pattern, and
a portion of a bottom end of the second portion is exposed to the seam.

2. The semiconductor device of claim 1, wherein the top end of the second portion is disposed at a height higher than a lower surface of the supporting pattern.

3. The semiconductor device of claim 1, wherein the bottom end of the second portion is disposed at a height higher or lower than a lower surface of the supporting pattern.

4. The semiconductor device of claim 1, wherein the seam included in the first portion includes a plurality of seams respectively disposed at different heights, and
the portion of the bottom end of the second portion is exposed to an uppermost seam among the plurality of seams.

5. The semiconductor device of claim 1, wherein the dielectric layer contacts the top end of the second portion.

6. The semiconductor device of claim 1, wherein the second portion has a seam-free structure.

7. The semiconductor device of claim 1, wherein the bottom electrode further includes a third portion on the second portion and including another seam, and
a portion of the dielectric layer is exposed to the another seam.

8. The semiconductor device of claim 7, wherein a top end of the third portion is disposed at a height lower than the upper surface of the supporting pattern and higher than a lower surface of the supporting pattern.

9. The semiconductor device of claim 7, wherein the dielectric layer contacts a top end of the third portion.

10. The semiconductor device of claim 7, wherein a portion of the top end of the second portion is exposed to the another seam.

11. The semiconductor device of claim 1, wherein a first width of the upper surface of the supporting pattern is different from a second width of a lower surface of the supporting pattern.

12. The semiconductor device of claim 11, wherein the first width is greater than the second width.

13. The semiconductor device of claim 1, wherein the supporting pattern includes a plurality of supporting patterns respectively disposed at different heights, and
the top end of the second portion is disposed at a height lower than an upper surface of an uppermost supporting pattern among the plurality of supporting patterns.

14. The semiconductor device of claim 13, wherein the bottom end of the second portion is disposed at a height higher or lower than a lower surface of the uppermost supporting pattern.

15. The semiconductor device of claim 1, wherein the dielectric layer contacts an upper portion of a side surface of the supporting pattern.

16. A semiconductor device, comprising:
a bottom electrode on a substrate;
a supporting pattern between the bottom electrode and an adjacent bottom electrode;
a top electrode covering the bottom electrode and the supporting pattern; and
a dielectric layer provided between the bottom electrode and the top electrode and between the supporting pattern and the top electrode,
wherein the bottom electrode includes a seam, and
a top end of the bottom electrode is disposed at a height lower than an upper surface of the supporting pattern and higher than a lower surface of the supporting pattern.

17. The semiconductor device of claim 16, wherein the seam included in the bottom electrode includes a plurality of seams respectively disposed at different heights.

18. The semiconductor device of claim 16, wherein a top end of the seam is disposed at a height higher or lower than the lower surface of the supporting pattern.

19. A semiconductor device, comprising:
a substrate including an active pattern;
an impurity region provided in the active pattern;
a word line disposed in the substrate and crossing the active pattern;
a bit line disposed on the substrate and extending in a direction crossing the word line;
a storage node contact disposed on the substrate and electrically connected to the impurity region;
a landing pad electrically connected to the storage node contact;
a bottom electrode electrically connected to the landing pad;
an upper supporting pattern and a lower supporting pattern provided between the bottom electrode and an adjacent bottom electrode;
a top electrode covering the bottom electrode and the upper supporting pattern; and
a dielectric layer provided between the bottom electrode and the top electrode and between the upper supporting pattern and the top electrode,
wherein the bottom electrode includes a first portion including a seam and a second portion on the first portion,
a top end of the second portion is disposed at a height lower than an upper surface of the upper supporting pattern, and
a portion of a bottom end of the second portion is exposed to the seam.

20. The semiconductor device of claim 19, wherein the bottom electrode further includes a third portion on the second portion and including another seam, and
a portion of the dielectric layer is exposed to the another seam.

* * * * *